United States Patent
Sutardja

(10) Patent No.: US 7,729,429 B1
(45) Date of Patent: Jun. 1, 2010

(54) ACTIVE REPLICA TRANSFORMER HYBRID

(75) Inventor: Sehat Sutardja, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 1442 days.

(21) Appl. No.: 11/030,205

(22) Filed: Jan. 7, 2005

Related U.S. Application Data

(63) Continuation of application No. 09/737,743, filed on Dec. 18, 2000, now Pat. No. 7,194,037.

(60) Provisional application No. 60/206,409, filed on May 23, 2000, provisional application No. 60/211,571, filed on Jun. 15, 2000.

(51) Int. Cl.
H04B 3/00 (2006.01)
H04L 25/00 (2006.01)

(52) U.S. Cl. .................. 375/258; 375/257; 375/219; 375/220; 375/221; 375/350; 370/286; 379/406.1

(58) Field of Classification Search .............. 375/258, 375/257, 219, 220, 222, 221, 350; 370/286; 379/406.1
See application file for complete search history.

(56) References Cited

U.S. PATENT DOCUMENTS

| | | | |
|---|---|---|---|
| 3,297,951 A | 1/1967 | Blasbalg | |
| 3,500,215 A | 3/1970 | Leuthold et al. | |
| 3,521,170 A | 11/1970 | Leuthold et al. | |
| 3,543,009 A | 11/1970 | Voelcher, Jr. | |
| 3,602,830 A | 8/1971 | Hurd | |
| 3,793,589 A | 2/1974 | Puckette | |
| 3,973,089 A | 8/1976 | Puckett | |
| 4,071,842 A | 1/1978 | Tewksbury | |
| 4,087,654 A * | 5/1978 | Mueller | 379/406.08 |
| 4,112,253 A | 9/1978 | Wilhelm | |
| 4,131,767 A | 12/1978 | Weinstein | |
| 4,152,541 A | 5/1979 | Yuen | |
| RE30,111 E | 10/1979 | Blood, Jr. | |
| 4,309,673 A | 1/1982 | Norberg et al. | |
| 4,321,753 A | 3/1982 | Fusari | |

(Continued)

FOREIGN PATENT DOCUMENTS

| | | |
|---|---|---|
| DE | 10 2004 017 497 | 11/2004 |
| EP | 0 800 278 | 8/1997 |
| JP | 57-48827 | 3/1982 |
| JP | 58-111415 | 7/1983 |
| JP | 62-159925 | 7/1987 |

(Continued)

OTHER PUBLICATIONS

"Gigabit Ethernet 1000Base-T," Gigabit Ethernet Alliance, copyright 1997.

(Continued)

*Primary Examiner*—Phuong Phu

(57) ABSTRACT

A communication circuit comprises a near end transmitter, and adjustable near end replication transmitter and a near end receiver. The near end transmitter is configured to generate a transmission signal and comprises a first plurality of current sources. Outputs of the first plurality of current sources are summed to generate the transmission signal. The adjustable near end replication transmitter comprises a second plurality of current sources. Outputs of the second plurality of current sources are summed to generate a replication signal in accordance with the transmission signal. The replication signal from the adjustable near end replication transmitter is subtracted from the transmission signal from the near end transmitter and a received signal from a communication channel to generate a subtraction signal. The near end receiver is configured to receive the subtraction signal.

22 Claims, 8 Drawing Sheets

U.S. PATENT DOCUMENTS

| | | | |
|---|---|---|---|
| 4,362,909 A | 12/1982 | Snijders et al. |
| 4,393,370 A | 7/1983 | Hareyama |
| 4,393,494 A | 7/1983 | Belforte et al. |
| 4,408,190 A | 10/1983 | Nagano |
| 4,464,545 A | 8/1984 | Werner |
| 4,503,421 A | 3/1985 | Hareyama et al. |
| 4,527,126 A | 7/1985 | Petrich et al. |
| 4,535,206 A | 8/1985 | Falconer |
| 4,591,832 A | 5/1986 | Fling et al. |
| 4,605,826 A | 8/1986 | Kanemasa |
| 4,621,172 A | 11/1986 | Kanemasa et al. |
| 4,621,356 A | 11/1986 | Scipione |
| 4,626,803 A | 12/1986 | Holm |
| 4,715,064 A | 12/1987 | Claessen |
| 4,727,566 A | 2/1988 | Dahlqvist |
| 4,746,903 A | 5/1988 | Czarniak et al. |
| 4,816,830 A | 3/1989 | Cooper |
| 4,817,081 A | 3/1989 | Wouda et al. |
| 4,868,571 A | 9/1989 | Inamasu |
| 4,878,244 A | 10/1989 | Gawargy |
| 4,888,762 A | 12/1989 | Arai |
| 4,894,820 A | 1/1990 | Miyamoto |
| 4,935,919 A | 6/1990 | Hiraguchi |
| 4,947,171 A | 8/1990 | Pfiefer et al. |
| 4,970,715 A | 11/1990 | McMahan |
| 4,972,360 A | 11/1990 | Cukier et al. |
| 4,988,960 A | 1/1991 | Tomisawa |
| 4,993,045 A | 2/1991 | Alfonso |
| 4,999,830 A | 3/1991 | Agazzi |
| 5,018,134 A | 5/1991 | Kokubo et al. |
| 5,043,730 A | 8/1991 | obinnata |
| 5,084,865 A | 1/1992 | Koike |
| 5,119,365 A | 6/1992 | Warner et al. |
| 5,136,260 A | 8/1992 | Yousefi-Elezei |
| 5,148,427 A | 9/1992 | Buttle et al. |
| 5,153,450 A | 10/1992 | Ruetz |
| 5,164,725 A | 11/1992 | Long |
| 5,175,764 A | 12/1992 | Patel et al. |
| 5,185,538 A | 2/1993 | Kondoh et al. |
| 5,202,528 A | 4/1993 | Iwaooji |
| 5,204,854 A | 4/1993 | Gregorian et al. |
| 5,204,880 A | 4/1993 | Wurster et al. |
| 5,212,659 A | 5/1993 | Scott et al. |
| 5,222,084 A | 6/1993 | Takahashi |
| 5,243,346 A | 9/1993 | Inami |
| 5,243,347 A | 9/1993 | Jackson et al. |
| 5,245,231 A | 9/1993 | Kocis et al. |
| 5,245,654 A | 9/1993 | Wilkison et al. |
| 5,248,956 A | 9/1993 | Himes |
| 5,253,249 A | 10/1993 | Fitzgerald et al. |
| 5,253,272 A | 10/1993 | Jaeger et al. |
| 5,254,994 A | 10/1993 | Takakura et al. |
| 5,267,269 A | 11/1993 | Shih et al. |
| 5,269,313 A | 12/1993 | DiPinto |
| 5,272,453 A | 12/1993 | Traynor et al. |
| 5,280,526 A | 1/1994 | Laturell |
| 5,282,157 A | 1/1994 | Murphy et al. |
| 5,283,582 A | 2/1994 | Krenik |
| 5,305,379 A | 4/1994 | Takeuchi |
| 5,307,064 A | 4/1994 | Kudoh |
| 5,307,405 A | 4/1994 | Sih |
| 5,323,157 A | 6/1994 | Ledzius et al. |
| 5,325,400 A | 6/1994 | Co et al. |
| 5,357,145 A | 10/1994 | Segaram |
| 5,365,935 A | 11/1994 | Righter et al. |
| 5,367,540 A | 11/1994 | Kakushi et al. |
| 5,375,147 A | 12/1994 | Awata et al. |
| 5,388,092 A | 2/1995 | Koyama et al. |
| 5,388,123 A | 2/1995 | Uesugi et al. |
| 5,392,042 A | 2/1995 | Pellon |
| 5,399,996 A | 3/1995 | Yates et al. |
| 5,418,478 A | 5/1995 | Van Brunt et al. |
| 5,440,514 A | 8/1995 | Flannagan et al. |
| 5,440,515 A | 8/1995 | Chang et al. |
| 5,444,739 A | 8/1995 | Uesegi et al. |
| 5,465,272 A | 11/1995 | Smith |
| 5,471,665 A | 11/1995 | Pace et al. |
| 5,479,124 A | 12/1995 | Pun et al. |
| 5,489,873 A | 2/1996 | Kamata et al. |
| 5,507,036 A | 4/1996 | Vagher |
| 5,508,656 A | 4/1996 | Jaffard et al. |
| 5,517,141 A | 5/1996 | Abdi et al. |
| 5,517,435 A | 5/1996 | Sugiyama |
| 5,521,540 A | 5/1996 | Marbot |
| 5,537,113 A | 7/1996 | Kawabata |
| 5,539,403 A | 7/1996 | Tani et al. |
| 5,539,405 A | 7/1996 | Norsworthy |
| 5,539,773 A | 7/1996 | Knee et al. |
| 5,559,476 A | 9/1996 | Zhang et al. |
| 5,568,064 A | 10/1996 | Beers et al. |
| 5,568,142 A | 10/1996 | Velazquez et al. |
| 5,572,158 A | 11/1996 | Lee et al. |
| 5,572,159 A | 11/1996 | McFarland |
| 5,577,027 A | 11/1996 | Cheng |
| 5,579,004 A | 11/1996 | Linz |
| 5,585,795 A | 12/1996 | Yuasa et al. |
| 5,585,802 A | 12/1996 | Cabler et al. |
| 5,587,681 A | 12/1996 | Fobbester |
| 5,589,788 A | 12/1996 | Goto |
| 5,596,439 A | 1/1997 | Dankberg et al. |
| 5,600,321 A | 2/1997 | Winen |
| 5,613,233 A | 3/1997 | Vagher |
| 5,625,357 A | 4/1997 | Cabler |
| 5,629,652 A | 5/1997 | Weiss |
| 5,648,738 A | 7/1997 | Welland et al. |
| 5,651,029 A | 7/1997 | Yang |
| 5,659,609 A | 8/1997 | Koizumi et al. |
| 5,663,728 A | 9/1997 | Essenwanger |
| 5,666,354 A | 9/1997 | Cecchi et al. |
| 5,684,482 A | 11/1997 | Galton |
| 5,687,330 A | 11/1997 | Gist et al. |
| 5,696,796 A | 12/1997 | Poklemba |
| 5,703,541 A | 12/1997 | Nakashima |
| 5,719,515 A | 2/1998 | Danger |
| 5,726,583 A | 3/1998 | Kaplinsky |
| 5,745,564 A | 4/1998 | Meek |
| 5,757,219 A | 5/1998 | Weedon et al. |
| 5,757,298 A | 5/1998 | Manley et al. |
| 5,760,726 A | 6/1998 | Koifman et al. |
| 5,790,060 A | 8/1998 | Tesche |
| 5,796,725 A | 8/1998 | Muraoka |
| 5,798,661 A | 8/1998 | Runaldue et al. |
| 5,798,664 A | 8/1998 | Nagahori et al. |
| 5,812,597 A | 9/1998 | Graham et al. |
| 5,821,892 A | 10/1998 | Smith |
| 5,822,426 A | 10/1998 | Rasmus et al. |
| 5,825,819 A | 10/1998 | Cogburn |
| 5,834,860 A | 11/1998 | Parsons et al. |
| 5,838,177 A | 11/1998 | Keeth |
| 5,838,186 A | 11/1998 | Inoue et al. |
| 5,841,386 A | 11/1998 | Leduc |
| 5,841,809 A | 11/1998 | Koizumi et al. |
| 5,844,439 A | 12/1998 | Zortea |
| 5,859,552 A | 1/1999 | Do et al. |
| 5,864,587 A | 1/1999 | Hunt |
| 5,880,615 A | 3/1999 | Bazes |
| 5,887,059 A | 3/1999 | Xie et al. |
| 5,894,496 A | 4/1999 | Jones |
| 5,898,340 A | 4/1999 | Chatterjee et al. |
| 5,930,686 A | 7/1999 | Devline et al. |
| 5,936,450 A | 8/1999 | Unger |
| 5,940,442 A | 8/1999 | Wong et al. |
| 5,940,498 A | 8/1999 | Bardl |
| 5,949,362 A | 9/1999 | Tesche et al. |

| | | | | | |
|---|---|---|---|---|---|
| 5,963,069 | A | 10/1999 | Jefferson et al. | 6,385,238 B1 | 5/2002 Nguyen et al. |
| 5,982,317 | A | 11/1999 | Steensgaard-Madsen | 6,385,442 B1 | 5/2002 Vu et al. |
| 5,999,044 | A | 12/1999 | Wohlfarth et al. | 6,389,077 B1 | 5/2002 Chan |
| 6,005,370 | A | 12/1999 | Gustavson et al. | 6,408,032 B1 | 6/2002 Lye et al. |
| 6,014,048 | A | 1/2000 | Talaga et al. | 6,411,647 B1 | 6/2002 Chan |
| 6,037,812 | A | 3/2000 | Gaudet | 6,415,003 B1 | 7/2002 Raghavan |
| 6,038,266 | A | 3/2000 | Lee et al. | 6,421,377 B1 | 7/2002 Langberg et al. |
| 6,043,766 | A | 3/2000 | Hee et al. | 6,421,534 B1 | 7/2002 Cook et al. |
| 6,044,489 | A | 3/2000 | Hee et al. | 6,433,608 B1 | 8/2002 Huang |
| 6,046,607 | A | 4/2000 | Kohdaka | 6,441,761 B1 | 8/2002 Viswanathan |
| 6,047,346 | A | 4/2000 | Lau et al. | 6,452,428 B1 | 9/2002 Mooney et al. |
| 6,049,706 | A | 4/2000 | Cook et al. | 6,462,688 B1 | 10/2002 Sutardja |
| 6,052,076 | A | 4/2000 | Patton, III et al. | 6,476,746 B2 | 11/2002 Viswanathan |
| 6,057,716 | A | 5/2000 | Dinteman et al. | 6,476,749 B1 | 11/2002 Yeap et al. |
| 6,067,327 | A | 5/2000 | Creigh et al. | 6,477,200 B1 | 11/2002 Agazzi et al. |
| 6,087,968 | A | 7/2000 | Roza | 6,492,922 B1 | 12/2002 New |
| 6,094,082 | A | 7/2000 | Gaudet | 6,501,402 B2 | 12/2002 Boxho |
| 6,100,830 | A | 8/2000 | Dedic | 6,509,854 B1 | 1/2003 Morita et al. |
| 6,121,831 | A | 9/2000 | Mack | 6,509,857 B1 | 1/2003 Nakao |
| 6,137,328 | A | 10/2000 | Sung | 6,531,973 B2 | 3/2003 Brooks et al. |
| 6,140,857 | A | 10/2000 | Bazes | 6,535,987 B1 | 3/2003 Ferrant |
| 6,148,025 | A | 11/2000 | Shirani et al. | 6,539,072 B1 | 3/2003 Donnelly et al. |
| 6,150,856 | A | 11/2000 | Morzano | 6,556,677 B1 | 4/2003 Hardy |
| 6,154,784 | A | 11/2000 | Liu | 6,563,870 B1 | 5/2003 Schenk |
| 6,163,283 | A | 12/2000 | Schofield | 6,570,931 B1 | 5/2003 Song |
| 6,163,289 | A | 12/2000 | Ginetti | 6,576,746 B2 | 6/2003 McBride et al. |
| 6,163,579 | A | 12/2000 | Harrington et al. | 6,577,114 B1 | 6/2003 Roo |
| 6,166,572 | A | 12/2000 | Yamoaka | 6,583,742 B1 | 6/2003 Hossak |
| 6,172,634 | B1 | 1/2001 | Leonowich et al. | 6,594,304 B2 | 7/2003 Chan |
| 6,173,019 | B1 | 1/2001 | Hee et al. | 6,608,743 B1 | 8/2003 Suzuki |
| 6,177,896 | B1 | 1/2001 | Min | 6,633,178 B2 | 10/2003 Wilcox et al. |
| 6,185,263 | B1 | 2/2001 | Chan | 6,687,286 B1 | 2/2004 Leonowich et al. |
| 6,188,282 | B1 | 2/2001 | Montalvo | 6,690,742 B2 | 2/2004 Chan |
| 6,191,719 | B1 | 2/2001 | Bult et al. | 6,714,825 B1 | 3/2004 Tanaka |
| 6,192,226 | B1 | 2/2001 | Fang | 6,721,379 B1 | 4/2004 Cranford, Jr. et al. |
| 6,201,490 | B1 | 3/2001 | Kawano et al. | 6,731,748 B1 | 5/2004 Edgar, III et al. |
| 6,201,831 | B1 | 3/2001 | Agazzi et al. | 6,744,831 B2 | 6/2004 Chan |
| 6,201,841 | B1 | 3/2001 | Iwamatsu et al. | 6,744,931 B2 | 6/2004 Komiya et al. |
| 6,204,788 | B1 | 3/2001 | Tani | 6,751,202 B1 | 6/2004 Henrie |
| 6,211,716 | B1 | 4/2001 | Nguyen et al. | 6,775,529 B1 | 8/2004 Roo |
| 6,215,429 | B1 | 4/2001 | Fischer et al. | 6,816,097 B2 | 11/2004 Brooks et al. |
| 6,223,061 | B1 | 4/2001 | Dacus et al. | 6,823,028 B1 | 11/2004 Phanse |
| 6,236,345 | B1 | 5/2001 | Dagnachew et al. | 6,844,837 B1 | 1/2005 Sutardja et al. |
| 6,236,346 | B1 | 5/2001 | Schofield | 6,864,726 B2 | 3/2005 Levin et al. |
| 6,236,645 | B1 | 5/2001 | Agazzi | 6,882,216 B2 | 4/2005 Kang |
| 6,249,164 | B1 | 6/2001 | Cranford, Jr. et al. | 7,095,348 B1 | 8/2006 Sutardja et al. |
| 6,249,249 | B1 | 6/2001 | Obayashi et al. | 7,113,121 B1 | 9/2006 Sutardja et al. |
| 6,259,680 | B1 | 7/2001 | Blackwell et al. | 7,194,037 B1 | 3/2007 Sutardja |
| 6,259,745 | B1 | 7/2001 | Chan | 7,280,060 B1 | 10/2007 Sutarjda et al. |
| 6,259,957 | B1 | 7/2001 | Alexander et al. | 7,312,739 B1 | 12/2007 Sutardja et al. |
| 6,266,367 | B1 | 7/2001 | Strait | 2001/0050585 A1 | 12/2001 Carr |
| 6,271,782 | B1 | 8/2001 | Steensgaard-Madsen | 2002/0009057 A1 | 1/2002 Blackwell et al. |
| 6,275,098 | B1 | 8/2001 | Uehara et al. | 2002/0061087 A1 | 5/2002 Williams |
| 6,288,604 | B1 | 9/2001 | Shih et al. | 2002/0084857 A1 | 7/2002 Kim |
| 6,289,068 | B1 | 9/2001 | Hassoun et al. | 2002/0136321 A1 | 9/2002 Chan |
| 6,295,012 | B1 | 9/2001 | Greig | 2002/0181601 A1 | 12/2002 Huang et al. |
| 6,298,046 | B1 | 10/2001 | Thiele | 2003/0002570 A1 | 1/2003 Chan |
| 6,307,490 | B1 | 10/2001 | Litfin et al. | 2003/0174660 A1 | 9/2003 Blon et al. |
| 6,309,077 | B1 | 10/2001 | Saif et al. | 2004/0005015 A1 | 1/2004 Chan |
| 6,313,775 | B1 | 11/2001 | Lindfors et al. | 2004/0090981 A1 | 5/2004 Lin et al. |
| 6,332,004 | B1 | 12/2001 | Chan | 2004/0091071 A1 | 5/2004 Lin et al. |
| 6,333,959 | B1 | 12/2001 | Lai et al. | 2004/0105504 A1 | 6/2004 Chan |
| 6,339,390 | B1 | 1/2002 | Velazquez et al. | 2004/0141569 A1 | 7/2004 Agazzi |
| 6,340,940 | B1 | 1/2002 | Melanson | 2004/0208312 A1 | 10/2004 Okuda |
| 6,346,899 | B1 | 2/2002 | Hadidi | 2005/0025266 A1 | 2/2005 Chan |
| 6,351,229 | B1 | 2/2002 | Wang | | |
| RE37,619 | E | 4/2002 | Mercer et al. | FOREIGN PATENT DOCUMENTS | |
| 6,369,734 | B2 | 4/2002 | Volk | | |
| 6,370,190 | B1 | 4/2002 | Young et al. | JP 63-300700 | 7/1988 |
| 6,373,417 | B1 | 4/2002 | Melanson | JP 63-300700 | 12/1988 |
| 6,373,908 | B2 | 4/2002 | Chan | JP 204527 | 8/1989 |
| 6,377,640 | B2 | 4/2002 | Trans | JP 3-273704 | 12/1991 |
| 6,377,683 | B1 | 4/2002 | Dobson et al. | JP 4-293306 | 10/1992 |

| | | |
|---|---|---|
| JP | 4-351109 | 12/1992 |
| JP | 05-064231 A | 3/1993 |
| JP | 06-029853 | 2/1994 |
| JP | 60-29853 | 2/1994 |
| JP | 06-97831 | 4/1994 |
| JP | 6-276182 | 9/1994 |
| JP | 7-131260 | 5/1995 |
| JP | 09-55770 | 8/1995 |
| JP | 09-270707 | 3/1996 |
| JP | 10-126183 | 5/1998 |
| JP | 2001-177409 | 12/1999 |
| JP | 06-97831 | 4/2005 |
| JP | 09-270707 | 4/2005 |
| JP | 2001-177409 | 4/2005 |
| TW | 0497334 | 8/2002 |
| TW | 0512608 | 12/2002 |
| TW | 0545016 | 8/2003 |
| WO | WO 99/46867 | 9/1999 |
| WO | WO 00/27079 | 5/2000 |
| WO | WO 00/28663 | 5/2000 |
| WO | WO 00/28663 A2 | 5/2000 |
| WO | WO 00/28663 A3 | 5/2000 |
| WO | WO 00/28668 | 5/2000 |
| WO | WO 00/28691 | 5/2000 |
| WO | WO 00/28691 A2 | 5/2000 |
| WO | WO 00/28691 A3 | 5/2000 |
| WO | WO 00/28712 | 5/2000 |
| WO | WO 00/35094 | 6/2000 |

OTHER PUBLICATIONS

The Electrical Engineering Handbook, Chapter 31, "D/A and A/D Converters," Richard C. Dorf, editor, CRC Press, 1993.
Sedra, et al. "Operational Amplifiers," Microelectronic Circuits, Chapter 2, Section 2.4, 3rd Edition, 1991, pp. 61-63.
H4000 Digital Ethernet Transceiver Technical Manual, Distributed Systems, Chapter 3, pp. 3-1 to 3-11, copyright 1982 by Digital Equipment Corporation.
Mueller, K.H., "Combining Echo Cancellation and Decision Feedback Equalization," The Bell System Technical Journal, vol. 58, No. 2, Feb. 1979, pp. 491-500.
Goldberg, Lee, "Gigabit Ethernet PHY Chip Sers LAN Speed Record for CopperStory," Tech Insights, Nov. 16, 1998.
U.S. Appl. No. 60/106,265, filed Oct. 30, 1998, Chan.
Bertolaccini, Mario, et al., A Precision Baseline Offset and Drift Corrector for Low-Frequency Applications, IEEE Transactions on Instrumentation and Measurement, vol. IM-34, No. 3, Sep. 1985, pp. 405-412.
Everitt, James, et al., "A CMOS Transceiver for 10-Mb/s and 100-Mb/s Ethernet," IEEE Journal of Solid-State Circuits, vol. 33, No. 12, Dec. 1998, pp. 2169-2177.
Kelly, N. Patrick, et al., "WA 18.5—A Mixed-Signal DFE/FFE Receiver for 100Base-TX Applications," ISSCC 2000/Session 18/Wireline Communications/Paper WA 18.5, 2000 IEEE International Sold-State Circuits Conference, pp. 310-311.
Song, Bang-Sup, et al., "FP 12.1: NRZ Timing Recovery Technique for Band-Limited Channels," ISSCC 96/Session 12/Serial Data Communications/Paper FP 12.1, 1996 IEEE International Solid State Circuits Conference pp. 194-196.
Stephens, "Active Output Impedance for ASDL Line Drivers", Nov. 2002.
Hamasaki, et al., "A 3-V, 22-mV Multibit Current-Mode $\Sigma\Delta$ DAC with 100 dB Dynamic Range", Dec. 1996, pp. 1888-1894.
Lee, et al., "A CMOS Serial Link for Fully Duplexed Data Communication", Apr. 1995.
Song, et al., FP 12.1: NRZ Timing Recovery Technique for Band-Limited Channels, 1996.
Song, et al., FP 12.1: NRZ Timing Recovery Technique for Band-Limited Channels (Slide Supplement), 1996.
Chien, "Monolithic CMOS Frequency Synthesizer for Cellular Applications", Mar. 12-13.
Chien, "Delay Based Monolithic CMOS Frequency Synthesizer for Portable Wireless Applications", May 20, 1998.
Chien, "Low-Noise Local Oscillator Design Techniques using DLL-based Frequency Multiplier for Wireless Applications", 2000.
Wang, et al., "A 1.2 GHz Programmable DLL-Based Frequency Multiplier for Wireless Applications", Dec. 2004.
Tsutomu Kamoto, "An 8-bit 2-ns Monolithic DAC", Feb. 1988.
Nack, et al., "A Constant Slew Rate Ethernet Line Driver", May 2001.
Song, "Dual Mode Transmitter with Adaptively Controlled Slew Rate and Impedance Supporting Wide Range Data Rates", 2001.
Johns, et al., "Integrated Circuits for Data Transmission Over Twisted Pair Channels", Mar. 1997, pp. 398-406.
"IEEE Standard 802.3: Part 3 Carrier Sense Multiple Access with Collision Detection (CSMA/CD) Access Method and Physical Detection", Mar. 8, 2002, pp. 1-378.
Young, et al., "A Low-Noise RF Voltage-Controlled Oscillator Using On-Chip High-Q Three-Dimensional Coil Inductor and Micromachined Variable Capacitor", Jun. 8-11, 1998, pp. 128-131.
Young, et al., "A Micromachined Variable Capacitor for Monolithic Low-Noise VCOS", 1996, pp. 86-89.
Abidi, et al., "FA 7.2: The Future of CMOS Wireless Transceivers", Feb. 7, 1997, pp. 118-119, 440.
Eto, et al., "A 333 MHz, 20mW, 18ps Resolution Digital DLL using Current-controlled Delay with Parallel Variables Resistor DAC (PVR-DAC)", Aug. 28-30, 2000, pp. 349-350.
Harald, et al., "Design of a 10-bit 100 MSamples/s BiCMOS D/A Converter", 1996, pp. 730-733.
Lee, et al., "A 3V 10b 100MS/s Digital-to-Analog Converter for Cable Modem Applications", Aug. 28-30, 2000, pp. 203-205.
Henriques, et al., "A CMOS Steering-Current Multiplying Digital-to-Analog Converter", 1995, pp. 145-155.
Wikner, et al., "Modeling of CMOS Digital-to-Analog Converters for Telecommunication", May 1999, pp. 489-499.
Van der Plas, et al., "A 14-Bit Intrinsic Accuracy $Q^2$ Random Walk CMOS DAC", Dec. 1999, pp. 1708-1718.
Radke, et al., "A 14-Bit Current-Mode $\Sigma\Delta$ DAC Based Upon Rotated Data Weighted Averaging", Aug. 2000, pp. 1074-1084.
Shui, et al., "Mismatch Shaping for a Current-Mode Multibit Delta-Sigma DAC", Mar. 1999, pp. 331-338.
Weaver, Jr., "A Third Method of Generation and Detection of Single-Sideband Signals," Dec. 1956, pp. 1703-1705.
Niknejad et al., "Analysis and Optimization of Monolithic Inductors and Transformers for RF ICs," 1997, pp. 375-378.
Niknejad et al., "Analysis, Design, and Optimization of Spiral Inductors and Transformers for Si RF IC's," Oct. 1998, pp. 1470-1481.
American National Standard, "Fibre Distributed Data Interface (FDDI)—Token Ring Twisted Pair Layer Medium Dependent (TP-PMD)," Sep. 25, 1995.
Nguyen et al., "Si IC-Compatible Inductors and LC Passive Filters," Aug. 1990, pp. 1028-1031.
Gardner, "Charge-Pump Phase-Lock Loops," Nov. 1980, pp. 1849-1858.
Davies, "Digital Generation of Low-Frequency Sine Waves," Jun. 1969, pp. 97-105.
Abidi, "TP 11.1: Direct-Conversion Radio Transceivers for Digital Communications," 1995.
Dolle, "A Dynamic Line-Termination Circuit for Multireceiver Nets," Dec. 1993, pp. 1370-1373.
Su et al., "Experimental Results and Modeling Techniques for Substrate Noise in Mixed-Signal Integrated Circuits," Apr. 1993, pp. 420-430.
Gray et al., "Future Directions in Silicon ICs for RF Personal Communications," 1995, pp. 83-90.
Gabara, "On-Chip Terminating Registers for High Speed ECL-CMOS Interfaces," 1992, pp. 292-295.
Horowitz et al., "High-Speed Electrical Signaling: Overview and Limitations," 1998, pp. 12-24.
Kim et al., "A 30-MHz Hybrid Analog/Digital Clock Recovery Circuit in 2-μm CMOS," 1990, pp. 1385-1394.
Liu et al., "WP 23.7: A 6.5 GHz Monolithic CMOS Voltage-Controlled Oscillator," 1999, pp. 404-405, 484.
Wang et al., "WP 23.8: A 9.8 GHz Back-Gate Tuned VCO in 0.35 μm CMOS," 1999, pp. 406-407, 484.
Rofougaran et al., "SP 24.6: A 900 MHz CMOS LC-Oscillator with Quadrature Outputs," 1996.

Koullias et al., "TP 9.2: A 900 MHz Transceiver Chip Set for Dual-Mode Cellular Radio Mobile Terminals," 1993, pp. 140-141, 278.
Dauphinee et al., "SP 23.7: A Balanced 1.5 GHz Voltage Controlled Oscillator with an Integrated LC Resonator," 1997, pp. 390-391, 491.
Banu et al., "A BiCMOS Double-Low-IF Receiver for GSM," 1997, pp. 521-524.
Chang et al., "A CMOS Channel-Select Filter for a Direct-Conversion Wireless Receiver," 1996, pp. 62-63.
Waizman, "FA 18.5: A Delay Line Loop for Frequency Synthesis of De-Skewed Clock," Feb. 18, 1994, pp. 298-299.
Kinget, "FP 14.7: A Fully Integrated 2.7V 0.35µm CMOS VCO for 5 GHz Wireless Applications," Feb. 5, 1998.
Lee et al., "A Fully Integrated Low-Noise 1-GHz Frequency Synthesizer Design for Mobile Communication Application," May 1997, pp. 760-765.
Parker et al., "A Low-Noise 1.6-GHz CMOS PLL with On-Chip Loop Filter," 1997, pp. 407, 409-410.
Park et al., "A Low-Noise, 900-MHz VCO in 0.6µm CMOS," May 1999, pp. 586-591.
Soyuer et al., "A Monolithic 2.3-Gb/s 100-mW Clock and Data Recovery Circuit in Silicon Bipolar Technology," Dec. 1993, pp. 1310-1313.
Hu et al., "A Monolithic 480 Mb/s Parallel AGC/Decision/Clock-Recovery Circuit in 1.2-µm CMOS," Dec. 1993, pp. 1314-1320.
Parameswaran et al., "A New Approach for the Fabrication of Micromechanical Structures," Dec. 6, 1998, pp. 289-307.
Cho et al., "TP 13.5: A Single-Chip CMOS Direct-Conversion Transceiver for 900 MHz Spread-Spectrum Digital Cordless Phones," 1999, pp. 228-229, 464.
Sedra et al., Microelectronic Circuits, Third Edition, 1991, pp. 86-92.
Moon et al., "An All Analog Multiphase Delay Locked Loop Using a Replica Delay Line for Wide Range Operation and Low-Jitter Performance," Mar. 2000, pp. 377-384.
I.E.E.E. Standard 802.3: Part 3, "Carrier SenseMultiple Access with Collision Detection (CSMA/CD) Access Method and Physical Detection," Mar. 8, 2002, pp. 1-378.
Shoval et al., "WA 18.7—A Combined 10/125 Mbaud Twisted-Pair Line Driver with Programmable Performance/Power Features," 2000, pp. 314-315.
Myson Technology, "MTD214—Ethernet Encoder/Decoder and 10BaseT Transceiver with Built-in Waveform Shaper," 1997, pp. 1-11.
Myson Technology, "MTD972 (Preliminary) 100BaseTX PCS/PMA," 1997, pp. 1-21.
Craninckx et al., "A 1.8-GHz Low-Phase-Noise CMOS VCO Using Optimized Hollow Spiral Inductors," 1997, pp. 736-744.
Craninckx et al., "A 1.8-GHz Low-Phase-Noise CMOS VCO Using Optimized Hollow Spiral Inductors," 1995, pp. 1474-1482.
Hung et al., "A 1.24-GHz Monolithic CMOS VCO with Phase Noise of 137 dBc/Hz at a 3-MHz Offset," 1999, pp. 111-113.
Rudell et al., "A 1.9-GHz Wide-Band IF Double Conversion CMOS Receiver for Cordless Telephone Applications," 1997, pp. 2071-2088.
Lin et al., "TP 12.5: A 1.4 GHz Differential Low-Noise CMOS Frequency Synthesizer using a Wideband PLL Architecture," 2000, pp. 204-205, 458.
Razavi, "SP 23.6: A 1.8 GHz CMOS Voltage-Controlled Oscillator," 1997, pp. 388-389.
Dec et al., "MP 4.8: A 1.9 GHz Micromachine-Based Low-Phase-Noise CMOS VCO," 1999, pp. 80-81, 449.
Sato et al., "SP 21.2: A 1.9 GHz Single-Chip IF Transceiver for Digital Cordless Phones," Feb. 10, 1996.
Rudell et al., "SA 18.3: A 1.9 GHz Wide-band IF Double Conversion CMOS Integrated Receiver for Cordless Telephone Applications," 1997, pp. 304-305, 476.
Lee et al., "A 2.5 V CMOS Delay-Locked Loop for an 18 Mbit, 500 Megabytes/s DRAM," 1994, pp. 1491-1496.
Leong et al., "A 2.7-V 900-MHz/1.9-GHz Dual-Band Transceiver IC for Digital Wireless Communication," 1999, pp. 286-291.
Lam et al., "WP 23.6: A 2.6 GHz/5.2 GHz CMOS Voltage-Controlled Oscillator," 1999, pp. 402-403, 484.
Marshall et al., "TA 8.7: A 2.7V GSM Transceiver ICs with On-Chip Filtering," 1995.

Sedra et al., Microelectronic Circuits, 3rd ed., 1991.
Yee et al., An Integratable 1-2.5 Gbps Low Jitter CMOS Transceiver with Built in Self Test Capability, 1999.
Intersil, HC-5509B ITU CO/Loop Carrier SLIC, Aug. 2003.
Regan, ADSL Line Driver/Receiver Design Guide, Part 1, Feb. 2000.
Phillps, The HC-5502X14X Telephone Subscriber Line Interface Circuits (SLIC), Jan. 1997.
Fuad et al., An Operational Amplifier Circulator Based on the Weighted Summer, Jun. 1975.
Narayanan et al., Doppler Estimation Using a Coherent Ultrawide-Band Random Noise Radar, Jun. 2000.
Stephens, Active Output Impedance for ADLS Line Drivers, Nov. 2002.
Everitt et al., A CMOS Transceiver for 10-Mb/s and 100-Mb/s Ethernet, Dec. 1998.
Azadet et al., A Gigabit Transceiver Chip Set for UTP CA-6 Cables in Digital CMOS Technology, Feb. 2000.
He et al., A DSP Receiver for 1000 Base-T PHY, 2001.
Baird et al., A Mixed Sample 120M s PRML Solution for DVD Systems, 1999.
Baker, An Adaptive Cable Equalizer for Serial Digital Rates to 400Mb/s, 1996.
Chan et al., A 100 Mb/s CMOS 100Base-T4 Fast Ethernet Transceiver for Category 3, 4 & 5 UTP, 1998.
Everitt et al., A 10/100Mb/s CMOS Ethernet Transceiver for 10BaseT, 10BaseTX and 100Base FX, 1998.
Kelly et al., A Mixed Signal DFE/Ffe Receiver for 100BaseTX Applications, 2000.
Shoaei et al., A 3V Low Power 0.25um CMOS 100Mb/s Receiver for Fast Ethernet, 2000.
Walker et al., A Two Chip 1.5 GBd Serial Link Interface, Dec. 1992.
Mueller, Combining Echo Cancellation and Decision Feedback Equalization, Feb. 29, 1979.
Roo et al., A CMOS Transceiver Analog Front-end for Gigabit Ethernet over Cat-5 Cables, 2001.
Shoval, A Combined 10/125 Mbaud Twisted Pair Line Driver with Programmable Performance/Power Features, 2000.
Knight, Jr. et al., A Self-Terminating Low-Voltage Swing CMOS Output Driver, 1988, 457-464.
Maneatis, Low-Jitter Process-Independent DLL and PLL Based on Self-Biased Techniques, Nov. 1996, 1723-1732.
Chang et al., Large Suspended Inductors on Silicon and Their Use in a 1-um CMOS RF Amplifier, May 1993, 246-248.
Gharpurey et al., Modeling and Analysis of Substrate Coupling in Integrated Cicuits, Mar. 1996, 344-353.
Young et al., Monolithic High-Performance three-Dimensional Coil Inductors for Wireless Communications, 1997.
Efendovich et al., Multifrequency Zero-Jitter Delay-Locked Loop, Jan. 1994, 67-70.
Niknejad et al., Numerically Stable Green Function for Modeling and Analysis fo Substrate Coupling in Integrated Circuits, Apr. 1998, 305-315.
Hajimiri et al., Phase Noise in Multi-Gigahertz CMOS Ring Oscillators, 1998, 49-52.
Rudell et al., Recent Developments in High Integration Multi-Standard CMOS Transceivers for Personal Communication Systems, 1998, 149-154.
Shoval et al., A 100 Mb/s BiCMOS Adaptive Pulse-Shaping Filter, Dec. 1995, 1692-1702.
Jansen et al., SP 23.8: Silicon Bipolar VCO Family for 1.1 to 2.2 GHz with Fully-Integrated Tank and Tuning Circuits, Feb. 8, 1997, 392-393 & 492.
Falconer; "Echo Cancellation in Two Wire Full Duplex With Estimation of Far-End Data Components"; Aug. 13, 1985.
Gawargy; "Electronic Hybrid Circuit"; Oct. 31, 1989.
Cho et al.; "A Single-Chip CMOS Direct Conversion Transceiver for 900 MHz Spread-Spectrum Digital Cordless Telephones"; 1999.
Shoval et al.; "A CMOS Mixed-Signal 100Mb/s Receive Architecture for Fast Ethernet"; 1999.
Hester et al.; "Codec for Echo-Canceling Full-Rate ADSL Modems"; Dec. 1999.
U.S. Appl. No. 60/106,265, filed Oct. 30, 1998, Chan.
U.S. Appl. No. 60/107,105, filed Nov. 4, 1998, Chan.

U.S. Appl. No. 60/107,702, filed Nov. 9, 1998, Chan.
U.S. Appl. No. 60/108,001, filed Nov. 11, 1998, Chan.
Liberali et al., "Progress in High-Speed and High -Resolution CMOS Data Converters", Sep. 12-14, 1995, pp. 19-28.
Sedra et al., "Micro-Electronic Circuits", 1982, pp. 95-97 and 243-247.
DP83220 CDL™ Twisted Pair FDDI Transceiver Device, Oct. 1992.
Su et al., "A CMOS Oversampling D/A Converter with a Current-Mode Semidigital Reconstruction Filter", Dec. 1993, pp. 1224-1233.
Miki et al., "An 80-MHz 8-bit CMOS D/A Converter", Dec. 1986, pp. 983-988.
Letham et al., "A high-performance CMOS 70-Mhzpalette/DAC", Dec. 1987, pp. 1041-1047.
Nakamura et al., "A 10-b 70-MS/s CMOS D/A/ converter", Apr. 1991, pp. 637-642.
Takakura et al., "A10 bit 80 MHz glitchless CMOS D/A/ converter", May 1991, pp. 26.5.1-26.5.4.
Fournier et al., "A 130-MHz 8-b CMOS video DAC for HDTV applications", Jul. 1991, pp. 1073-1077.
Reynolds, "A 320 MHz CMOS triple 8b DAC with on-chip PLL and hardware cursor", Feb. 1994, pp. 50-51.
Chin et al., "A 10-b 125 MHz CMOS digital-to-analog (DAC) with threshold-voltage compensated current sources", Nov. 1994, pp. 1374-1380.
Wu et al., A low glitch 10-bit 75-MHz CMOS video D/A converter, Jan. 1995, pp. 68-72.
Gray et al., Analysis and Design of Analog Integrated Circuits, 1997.
Sedra et al., Microelectronic Circuits, Third Edition, 1991, pp. 48-115.
Lee, et al., "A CMOS Serial Link for Fully Duplexed Data Communication", Apr. 1995.
Shoval et al., "WA 18.7—A Combined 10/125 Mbaud Twisted-Pair Line Driver with Programmable Performance/Power Features," 2000, pp. 314-315.
Song, et al., FP 12.1: NRZ Timing Recovery Technique for Band-Limited Channels (Slide Supplement), 1996.
Chien, "Monolithic CMOS Frequency Synthesizer for Cellular Applications", Mar. 12-13.
Chien, "Delay Based Monolithic CMOS Frequency Synthesizer for Portable Wireless Applications", May 20, 1998.
Chien, "Low-Noise Local Oscillator Design Techniques using DLL-based Frequency Multiplier for Wireless Applications", 2000.
Cho et al.; "A Single-Chip CMOS Direct Conversion Transceiver for 900 MHz Spread-Spectrum Digital Cordless Telephones"; 1999.
Shoval et al.; "A CMOS Mixed-Signal 100Mb/s Receive Architecture for Fast Ethernet"; 1999.
Hester et al.; "CODEC for Echo-Canceling Full-Rate ADSL Modems"; Dec. 1999.
Nack, et al., "A Constant Slew Rate Ethernet Line Driver", May 2001.
Song, "Dual Mode Transmitter with Adaptively Controlled Slew Rate and Impedance Supporting Wide Range Data Rates", 2001.
Yee et al., An Integratable 1-2.5 Gbps Low Jitter CMOS Transceiver with Built in Self Test Capability, 1999.
Intersil, HC-5509B ITU CO/Loop Carrier SLIC, Aug. 2003.
Regan, ADSL Line Driver/Receiver Design Guide, Part 1, Feb. 2000.
Phillps, The HC-5502X14X Telephone Subscriber Line Interface Circuits (SLIC), Jan. 1997.
Fuad Surial Atiya, et al., An Operational Amplifier Circulator Based on the Weighted Summer, Jun. 1975.
Narayanan et al., Doppler Estimation Using a Coherent Ultrawide-Band Random Noise Radar, Jun. 2000.
Stephens, Active Output Impedance for ADLS Line Drivers, Nov. 2002.
Azadet et al., A Gigabit Transceiver Chip Set for UTP CA-6 Cables in Digital CMOS Technology, Feb. 2000.
He et al., A DSP Receiver for 1000 Base-T PHY, 2001.
Baird et al., A Mixed Sample 120M s PRML Solution for DVD Systems, 1999.
Baker, An Adaptive Cable Equalizer for Serial Digital Rates to 400Mb/s, 1996.
Everitt et al., A 10/100Mb/s CMOS Ethernet Transceiver for 10BaseT, 10BaseTX and 100Base FX, 1998.
Roo et al., A CMOS Transceiver Analog Front-end for Gigabit Ethernet over Cat-5 Cables, 2001.
Shoaei et al., A 3V Low Power 0.25um CMOS 100Mb/s Receiver for Fast Ethernet, 2000.
Walker et al., A Two Chip 1.5 GBd Serial Link Interface, Dec. 1992.
Lee, et al., A 3V 10b 100 MS/s Digital-to-Analog Converter for Cable Modem Applications, Aug. 28-30, 2000 pp. 203-205.
Rudell, et al., "SA 18.3: A 1.9 GHz Wide-band IF Double Conversion CMOS Integrated Receiver for Cordless Telephone Applications," 1997, pp. 304-305, 476.
Young, et al., Monolithic High-Performance three-Dimensional Coil Inductors for Wireless Communications, 1997.
Wu, et al., A low glitch 10-bit 75 MHz CMOS video D/A converter, Jan. 1995, pp. 68-72.
Johns, et al., "Integrated Circuits for Data Transmission Over Twisted Pair Channels", Mar. 1997, pp. 398-406.
"IEEE Standard 802.3: Part 3 Carrier Sense Multiple Access with Collision Detection (CSMA/CD) Access Method and Physical Detection", Mar. 8, 2002, pp. 1-1538.
Young, et al., "A Low-Noise RF Voltage-Controlled Oscillator Using On-Chip High-Q Three-Dimensional Coil Inductor and Micromachined Variable Capacitor", Jun. 8-11, 1998, pp. 128-131.
Young, et al., "A Micromachined Variable Capacitor for Monolithic Low-Noise VCOS", 1996, pp. 86-89.
Abidi, et al., "FA 7.2: The Future of CMOS Wireless Transceivers", Feb. 7, 1997, pp. 118-119, 440.
Eto, et al., "A 333 MHz, 20mW, 18ps Resolution Digital DLL using Current-controlled Delay with Parallel Variables Resistor DAC (PVR-DAC)", Aug. 28-30, 2000, pp. 349-350.
Ivan Jorgensen, et al., "Design of a 10-bit 100 MSamples/s BiCMOS D/A Converter", 1996, pp. 730-733.
Henriques, et al., "A CMOS Steering-Current Multiplying Digital-to-Analog Converter", 1995, pp. 145-155.
Wikner, et al., "Modeling of CMOS Digital-to-Analog Converters for Telecommunication", May 1999, pp. 489-499.
Van der Plas, et al., "A 14-Bit Intrinsic Accuracy $Q^2$ Random Walk CMOS DAC", Dec. 1999, pp. 1708-1718.
Radke, et al., "A 14-Bit Current-Mode $\Sigma\Delta$ DAC Based Upon Rotated Data Weighted Averaging", Aug. 2000, pp. 1074-1084.
Shui, et al., "Mismatch Shaping for a Current-Mode Multibit Delta-Sigma DAC", Mar. 1999, pp. 331-338.
Hamasaki, et al., "A 3-V, 22-mV Multibit Current-Mode $\Sigma\Delta$ DAC with 100 dB Dynamic Range", Dec. 1996, pp. 1888-1894.
Tsutomu Kamoto, "An 8-bit 2-ns Monolithic DAC", Feb. 1988.
Weaver, Jr., "A Third Method of Generation and Detection of Single-Sideband Signals," Dec. 1956, pp. 1703-1705.
Niknejad et al., "Analysis and Optimization of Monolithic Inductors and Transformers for RF ICs," 1997, pp. 375-378.
Niknejad et al., "Analysis, Design, and Optimization of Spiral Inductors and Transformers for Si RF IC's," Oct. 1998, pp. 1470-1481.
American National Standard, "Fibre Distributed Data Interface (FDDI)—Token Ring Twisted Pair Layer Medium Dependent (TP-PMD)," Sep. 25, 1995.
Nguyen et al., "Si IC-Compatible Inductors and LC Passive Filters," Aug. 1990, pp. 1028-1031.
Gardner, "Charge-Pump Phase-Lock Loops," Nov. 1980, pp. 1849-1858.
Davies, "Digital Generation of Low-Frequency Sine Waves," Jun. 1969, pp. 97-105.
Abidi, "TP 11.1: Direct-Conversion Radio Transceivers for Digital Communications," 1995.
Dolle, "A Dynamic Line-Termination Circuit for Multireceiver Nets," Dec. 1993, pp. 1370-1373.
Su et al., "Experimental Results and Modeling Techniques for Substrate Noise in Mixed-Signal Integrated Circuits," Apr. 1993, pp. 420-430.
Gray et al., "Future Directions in Silicon ICs for RF Personal Communications," 1995, pp. 83-90.
Gabara, "On-Chip Terminating Registers for High Speed ECL-CMOS Interfaces," 1992, pp. 292-295.
Horowitz et al., "High-Speed Electrical Signaling: Overview and Limitations," 1998, pp. 12-24.

Efendovich et al., Multifrequency Zero-Jitter Delay-Locked Loop, Jan. 1994, 67-70.

Niknejad et al., Numerically Stable Green Function for Modeling and Analysis of Substrate Coupling in Integrated Circuits, Apr. 1998, 305-315.

Hajimiri et al., Phase Noise in Multi-Gigahertz CMOS Ring Oscillators, 1998, 49-52.

Kim et al., "A 30-MHz Hybrid Analog/Digital Clock Recovery Circuit in 2-μm CMOS," 1990, pp. 1385-1394.

Liu et al., "WP 23.7: A 6.5 GHz Monolithic CMOS Voltage-Controlled Oscillator," 1999, pp. 404-405, 484.

Wang et al., "WP 23.8: A 9.8 GHz Back-Gate Tuned VCO in 0.35 μm CMOS," 1999, pp. 406-407, 484.

Rofougaran et al., "SP 24.6: A 900 MHz CMOS LC-Oscillator with Quadrature Outputs," 1996.

Koullias et al., "TP 9.2: A 900 MHz Transceiver Chip Set for Dual-Mode Cellular Radio Mobile Terminals," 1993, pp. 140-141, 278.

Dauphinee et al., "SP 23.7: A Balanced 1.5 GHz Voltage Controlled Oscillator with an Integrated LC Resonator," 1997, pp. 390-391, 491.

Banu et al., "A BiCMOS Double-Low-IF Receiver for GSM," 1997, pp. 521-524.

Chang et al., "A CMOS Channel-Select Filter for a Direct-Conversion Wireless Receiver," 1996, pp. 62-63.

Waizman, "FA 18.5: A Delay Line Loop for Frequency Synthesis of De-Skewed Clock," Feb. 18, 1994, pp. 298-299.

Kinget, "FP 14.7: A Fully Integrated 2.7V 0.35μm CMOS VCO for 5 GHz Wireless Applications," Feb. 5, 1998.

Lee et al., "A Fully Integrated Low-Noise 1-GHz Frequency Synthesizer Design for Mobile Communication Application," May 1997, pp. 760-765.

Parker et al., "A Low-Noise 1.6-GHz CMOS PLL with On-Chip Loop Filter," 1997, pp. 407, 409-410.

Park et al., "A Low-Noise, 900-MHz VCO in 0.6μm CMOS," May 1999, pp. 586-591.

Soyuer et al., "A Monolithic 2.3-Gb/s 100-mW Clock and Data Recovery Circuit in Silicon Bipolar Technology," Dec. 1993, pp. 1310-1313.

Hu et al., "A Monolithic 480 Mb/s Parallel AGC/Decision/Clock-Recovery Circuit in 1.2-μm CMOS," Dec. 1993, pp. 1314-1320.

Parameswaran et al., "A New Approach for the Fabrication of Micromechanical Structures," Dec. 6, 1998, pp. 289-307.

Knight, Jr. et al., A Self-Terminating Low-Voltage Swing CMOS Output Driver, 1988, 457-464.

Maneatis, Low-Jitter Process-Independent DLL and PLL Based on Self-Biased Techniques, Nov. 1996, 1723-1732.

Chang et al., Large Suspended Inductors on Silicon and Their Use in a 1-um CMOS RF Amplifier, May 1993, 246-248.

Gharpurey et al., Modeling and Analysis of Substrate Coupling in Integrated Ciuits, Mar. 1996, 344-353.

Shoval et al., "WA 18.7—A Combined 10/125 Mbaud Twisted-Pair Line Driver with Programmable Performance/Power Features," 2000, pp. 314-315.

Myson Technology, "MTD214—Ethernet Encoder/Decoder and 10BaseT Transceiver with Built-in Waveform Shaper," 1997, pp. 1-11.

Myson Technology, "MTD972 (Preliminary) 100BaseTX PCS/PMA," 1997, pp. 1-21.

Craninckx et al., "A 1.8-GHz Low-Phase-Noise CMOS VCO Using Optimized Hollow Spiral Inductors," 1997, pp. 736-744.

Craninckx et al., "A 1.8-GHz Low-Phase-Noise Voltage-Controlled Oscillator with Prescaler," 1995, pp. 1474-1482.

Hung et al., "A 1.24-GHz Monolithic CMOS VCO with Phase Noise of 137 dBc/Hz at a 3-MHz Offset," 1999, pp. 111-113.

Rudell et al., "A 1.9-GHz Wide-Band IF Double Conversion CMOS Receiver for Cordless Telephone Applications," 1997, pp. 2071-2088.

Lin et al., "TP 12.5: A 1.4 GHz Differential Low-Noise CMOS Frequency Synthesizer using a Wideband PLL Architecture," 2000, pp. 204-205, 458.

Razavi, "SP 23.6: A 1.8 GHz CMOS Voltage-Controlled Oscillator," 1997, pp. 388-389.

Dec et al., "MP 4.8: A 1.9 GHz Micromachine-Based Low-Phase-Noise CMOS VCO," 1999, pp. 80-81, 449.

Sato et al., "SP 21.2: A 1.9 GHz Single-Chip IF Transceiver for Digital Cordless Phones," Feb. 10, 1996.

Lee et al., "A 2.5 V CMOS Delay-Locked Loop for an 18 Mbit, 500 Megabytes/s DRAM," 1994, pp. 1491-1496.

Joo Leong Tham, et al., "A 2.7-V 900-MHz/1.9-GHz Dual-Band Transceiver IC for Digital Wireless Communication," 1999, pp. 286-291.

Lam et al., "WP 23.6: A 2.6 GHz/5.2 GHz CMOS Voltage-Controlled Oscillator," 1999, pp. 402-403, 484.

Marshall et al., "TA 8.7: A 2.7V GSM Transceiver ICs with On-Chip Filtering," 1995.

Rudell et al., Recent Developments in High Integration Multi-Standard CMOS Transceivers for Personal Communication Systems, 1998, 149-154.

Shoval et al., A 100 Mb/s BiCMOS Adaptive Pulse-Shaping Filter, Dec. 1995, 1692-1702.

Jansen et al., SP 23.8: Silicon Bipolar VCO Family for 1.1 to 2.2 GHz with Fully-Integrated Tank and Tuning Circuits, Feb. 8, 1997, 392-393 & 492.

Cho et al.; "A Single-Chip CMOS Direct Conversion Transceiver for 900 MHz Spread-Spectrum Digital Cordless Telephones"; 1999.

Liberali et al., "Progress in High-Speed and High -Resolution CMOS Data Converters", Sep. 12-14, 1995, pp. 19-28.

Sedra et al., "Micro-Electronic Circuits", 1982, pp. 95-97 and 243-247.

DP83220 CDL™ Twisted Pair FDDI Transceiver Device, Oct. 1992.

Miki et al., "An 80-MHz 8-bit CMOS D/A Converter", Dec. 1986, pp. 983-988.

Letham et al., "A high-performance CMOS 70-Mhzpalette/DAC", Dec. 1987, pp. 1041-1047.

Nakamura et al., "A 10-b 70-MS/s CMOS D/A/ converter", Apr. 1991, pp. 637-642.

Takakura et al., "A10 bit 80 MHz glitchless CMOS D/A/ converter", May 1991, pp. 26.5.1-26.5.4.

Fournier et al., "A 130-MHz 8-b CMOS video DAC for HDTV applications", Jul. 1991, pp. 1073-1077.

Reynolds, "A 320 MHz CMOS triple 8b DAC with on-chip PLL and hardware cursor", Feb. 1994, pp. 50-51.

Chin et al., "A 10-b 125 MHz CMOS digital-to-analog (DAC) with threshold-voltage compensated current sources", Nov. 1994, pp. 1374-1380.

Chan, et al., A 100 Mb/s CMOS 100Base-T3 Fast Ethernet Transceiver for Category 3, 4, & 5 UTP, 1998.

Wang, et al., A 1.2 GHz programmable DLL-Based Frequency Multiplier for Wireless Applications, Dec. 2004.

Sedra, et al., Microelectronic Circuits, 3rd Edition, 1991.

U.S. Appl. No. 09/920,240, filed Aug. 1, 2001, Roo.

U.S. Appl. No. 09/920,241, filed Aug. 1, 2001, Sutardja.

Dunning, Jim, "An All-Digital Phase-Locked Loop with 50-Cycle Lock Time Suitable for High-Performance Microprocessors," IEEE Journal of Solid-State Circuits, vol. 30, No. 4, Apr. 1995, pp. 412-422.

Moon, Yongsam, et al., "An All-Analog Multiphase Delay-Locked Loop Using a Replica Delay Line for Wide-Range Operation and Low-Jitter Performance," IEEE Journal of Solid-State Circuits, vol. 35, No. 3, Mar. 2000, pp. 377-384.

Wang, HongMo, "WP 23.8: a 9.8GHz Back-Gate Tuned VCO in 0.35μm CMOS," ISSCC99, Session 23, Paper WP 23.8, 1999 IEEE International Solid-State Circuits Conference, pp. 406-407 & 484.

Rudell, et al., "SA 18.3: A 1.9 GHz Wide-Bank IF Double Conversion CMOS Integrated Receiver for Cordless Telephone Applications," 1997, pp. 304-305, 476.

Wang, et al., "A 1.2 GHz Programmable DLL-Based Frequency Multiplier for Wireless Applications," IEEE Transactions on Very Large Scale Integration (VLSI) Systems, vol. 12, No. 12, Dec. 2004, pp. 1377-1381.

Kamran Azadet and Chris Nicole; Low-Power Equalizer Architectures for High-Speed Modems; Oct. 1998; pp. 118-126.

Yamaguchi, et al.; "400 Mbit/s Submarine Optical Repeater Using Integrated Circuits"; Gujitsu Laboratories Ltd. With Engllish Language Translation; 1988.

Uda, et al., "125Mbit/s Fiber Optic Transmitter/Receiver with Duplex Connector"; Fiber Optic Communications Development Div., NEC Corp., NEC Engineering, Ltd., With English Language Translation; 1988.

IEEE Standards 802.3ab-2002. "Part 3: Carrier sense multiple access with collision detection (CSMA/CD) access method and physical layer specifications"; 2002; pp. 147-249.

Linear Technology, High Speed Moden Solutions, InfoCard 20; Linear Technology Corp.; 1997.

Linear Technology, LT1355/LT1356, Dual and Quad 12 MHz, 400V/μs Op Amps; Linear Technology Corp.; pp. 1-16; 1997.

Linear Technology, LT1358/LT1359, Dual and Quad 25 MHz, 600V/μs Op Amps; Linear Technology Corp.; pp. 1-12; 1997.

Linear Technology, LT1361/LT1362, Dual and Quad 50 MHz, 800V/μs Op Amps; Linear Technology Corp.; pp. 1-12; 1997.

Linear Technology, LT1364/LT1365, Dual and Quad 70MHz, 1000V/μs Op Amps; Linear Technology Corp.; pp. 1-12; 1997.

Linear Technology, LT1813/LT1814, Dual/Quad 3mA, 100 MHz, 750Vμs Operational Amplifiers, Linear Technology Corp.; pp. 1-16; 1997.

Hellwarth, et al., "Digital to analog converter having Common-mode Isolation and Differential Output"; Jul. 1972.

Millman, et al., "Pulse, Digital, and Switching Waveforms"; 1965; pp. 674-675.

Dally, et al., "Digital Systems Engineering"; 1998; cover and pp. 390-391.

Van de Plassche, Integrated Analog-to-Digital and Digital-to-Analog Converters; 1994; Chapter 6, pp. 211-271.

Chien, et al., "TP 12.4: A 900-MHz Local Oscillator using a DLL-based Frequency Multiplier Technique for PCS Applications"; Feb. 8, 2000.

Weigandt, et al., "Analysis of Timing Jitters in CMOS Ring Oscillators." 1994; pp. 27-30.

Gray, et al. "Analysis and Design of Analog Integrated Circuit", Fourth Edition; Mar. 2001, pp. 217-221.

Dally, et al., "High Performance Electrical Signaling"; Jun. 1998.

High Speed Modem Solutions Info Card 20; 1998.

Hellums et al., "An ADSI Integrated Active Hybrid Circuit"; Sep. 2003.

Linear Technology, High Speed Modem Solutions Info Card; 1997.

Munshi, et al. "Adaptive Impedance Matching"; Jun. 1994.

Kim et al., "PLL/DLL System Noise Analysis for Low Jitter Clock Synthesizer Design"; Jun. 1994; pp. 31-34.

Goldberg, Gigabit Ethernet PHY Chip Sets LAN Speed Record for Copper Story; Nov. 16, 1998; 6 pages.

The Authoritative Dictionary of IEEE Standards Stems 7th Edition; Dec. 2000; p. 280.

Rao, Short Course: Local Area Networks; 1999.

Razavi, "Principles of Data Conversion System Design"; Dec. 1994.

Mano, "Digital Logic and Computer Design"; 1979.

Farjad-rad, et al., "4.5 A 0.2-2GHz 12mW Multiplying DLL for Low-Jitter Clock Synthesis in Highly Integrated Data Communication Chip"; 2002.

Gotoh, et al., "All-Digital Multi-Phase Delay Locked Loop for Internal Timing Generation in Embedded and/or high-Speed DRAMS"; Jun. 1997.

Johnson, et al., "THAM 11.2: A Variable Delay Line Phase Locked Loop for CPU-Coprocessor Synchronization"; Feb. 1998.

Senntag, et al., "FAM: 11.5: A Monolithic CMOS 10MHz DPLL for Burse-Mode"; 1990.

Garlepp, et al., "A Portable Digital DLL Architecture for CMOS Interface Circuits"; Jun. 1998.

Lin, et al. "A Register-Controller Symmetrical DLL for Double-Data-Rate DRAM"; Apr. 1999.

Garlepp, et al., "A Portable Digital DLL for High Speed CMOS Interface Circuits"; May 1999.

Dehng, et al., "Clock-Deskaw Buffer Using a SAR-Controlled Delay-Locked Loop"; Aug. 2000.

Kim, et al., "A Low-Power Small-Area 7.28-ps-Jitter-1-GHz DLL Based Clock Generator"; Nov. 2002.

Dehng, et al., "A Fast Lock Mixed Mode DLL Using a s-B SAR Algorithm"; Oct. 2001.

Lin, et al., "A 10-b, 500-Msample/s CMOS DAC in 0.6mm2"; Dec. 1998.

Maneatis, John G., "FA 8.1: Low-Jitter and Process-Independent DLL and PLL Based on Self-Biased Techniques"; Feb. 1996.

Sailesh Rao; Short Course: Local Area Networks, International Solid State Circuits Conference; Sailesh Rao; Outline implementing Gigabit Ethernet Over Cat-5 Twisted-Pair Cabling; Jack Kenny; Signal Processing and Detection in Gigabit Ethernet; 1999; 3 pages.

Techdictionary.com definition of decoder, Link: http://www.techdictionary.com; As of Jul. 21, 2008; 1 page.

University of Pennsylvania CSE Digital Logic Lab re decoders. Link: http://www.cse,dmu.ac.uk/~sexton/WWW/Pages/cs2.html; As of Jul. 21, 2008; 3 pages.

* cited by examiner

ACTIVE REPLICA TRANSFORMER HYBRID

CROSS REFERENCE TO RELATED APPLICATIONS

This application is a continuation of U.S. application Ser. No. 09/737,743, filed Dec. 18, 2000, which claims priority under 35 U.S.C. §119(e) to U.S. Provisional Application Ser. No. 60/206,409, entitled "Active Replica Transformer Hybrid," filed May 23, 2000, and to U.S. Provisional Application Ser. No. 60/211,571, entitled "Active Replica Transformer Hybrid," filed Jun. 15, 2000, the contents of each of which are incorporated by reference herein.

This application is related to the following commonly-assigned application: "Direct Drive Programmable High Speed Power Digital-to-Analog Converter," filed Dec. 18, 2000, and assigned U.S. application Ser. No. 09/737,474 (now U.S. Pat. No. 6,462,688), the contents of which are incorporated by reference herein.

BACKGROUND

1. Field of the Invention

This invention relates to an active replication transmitter circuit for near end transmission cancellation and more specifically to an adjustable replication transmitter circuit with a low pass filter.

2. Background Information

Hybrids are widely used in communication systems that send and receive signals on a single pair of wires. In order to detect the signals with error free performance, it is important that near end transmission from the nearby-transmitted signal be removed from the received signal. A good hybrid is defined as a hybrid that can reject most of the near end transmission signal from the desired received signal. A good hybrid is important, because as the distance between two ends of a communicating/network nodes increases, the received signal strength decreases, while near end transmission signal from the nearby transmitted signal stays approximately constant. In order to detect the received signal with error free performance, it is important that any near end transmission signal from the nearby transmitted signal is removed from the received signal.

In many conventional communications systems, such as PC modems, ADSL, VDSL and the like, operating on standard twisted pair telephone wires, the two ends of the communicating nodes are isolated by one or more isolation transformers. There are two types of conventional hybrids typically used in such applications. The first is a bridge hybrid, also referred to as a resistive bridge hybrid. The second type is a hybrid transformer. For these types of applications, these hybrids generally work well, because these applications do not usually utilize the low frequency range of the communications bandwidth. Another term for this is DC free signaling.

Newer communication systems, such as gigabit Ethernet (I.E.E.E. standard 802.3ab), use a non-DC free signaling. Unfortunately, conventional hybrids only work well for rejecting higher frequency near end transmission signals. Therefore, extremely complicated digital signal processing (DSP) based echo canceling technology is needed to reject not only the residual high frequency echo but also the large amplitude low frequency echo signal. This low frequency echo signal is seen by the receiver as transmitter base line wander.

U.S. Pat. No. 4,935,919 to Hiraguchi is directed to an echo canceler in a modem, which cancels echoes from hybrid transformers on both the near end and the far end. The echo canceler has a variable delay, which may be adjusted to conform to a round trip of an echo. An adaptive filter has a number of delay circuits, each adding an increment of delay. A number of these delay circuits are selected in order to provide a selected delay time.

U.S. Pat. No. 5,305,379 to Takeuchi, et al. describes a sending data buffer for holding sending data temporarily and transmitting the data to an echo canceler section. The data buffer is installed between a sending section and an echo canceler that is included in a subscriber line circuit of an integrated service digital network. The sending data buffer is operated in a shift register mode during a sending training mode, and operated in FIFO (first in-first out) mode during a sending/receiving training mode.

FIG. 1 shows a block diagram of a communication system showing a near end transmitter 12 (NET), near end receiver 14 (NER), in communication with a near end hybrid 10. A wire link 16, usually a twisted wire pair, connects the near end hybrid to a far end hybrid 11 which is in communication with a far end receiver 15 (FER) and a far end transmitter 13 (FET). Desired transmission is from the near end transmitter 12 to the far end receiver 15 and from the far end transmitter 13 to the near end receiver 14. It is important to reject or attenuate near end transmission signals from the near end transmitter 12 to the near end receiver 14.

FIG. 2A shows a diagram of the near end of such a communication system having cross talk attenuation. In this arrangement, NET 12 is configured as a current source. Current generated by the current source flows through output resistor R and develops a voltage across output resistor R. Alternatively, as shown in FIG. 2B, NET 12' may be configured as a voltage source having resistors R1 and R2. In either arrangement, NET 12 (12') feeds the primary of an isolation transformer 20. The secondary of the isolation transformer 20 is connected to a twisted wire pair communication link 22, which will be connected to a far end circuit, not shown. A replication transmitter 18 is provided to attempt to eliminate near end transmission signals from transmitter 12 (12'). The output of replication transmitter 18 is subtracted from the primary of the isolation transformer 20 by subtraction circuit 24. The output of subtraction circuit 24 is provided as an input to NER 14. Thus, the input NER 14 comprises the received signal and the transmitted signal less the replication signal. In order to eliminate effectively the effects of NET 12, the voltage developed at the output of NET 12 (I×R) should be equal to the voltage developed by replication transmitter 18 or I×$R_{replication}$. In other words, $R_{replication}$ should be equal to R. However, due to process variations, it is difficult to ensure that $R_{replication}$ is equal to R. As a result, such a conventional arrangement does not sufficiently eliminate the effects from NET 12 (12').

SUMMARY OF THE INVENTION

This invention solves these problems by using a circuit with an adjustable replication transmitter and a high pass filter to provide cross talk attenuation over a wide frequency range. The adjustable replication transmitter is adjusted so that the amplitude of the voltages at the replication transmitter provides the best possible cross talk attenuation. The high pass filter compensates for the reduced load seen by the near end transmitter at very low frequencies in order to provide effective cross talk attenuation to very low frequencies. The adjustable replication transmitter and the high pass filter can be used separately or together.

According to a first aspect of the present invention, a communication circuit comprises a near end transmitter, a hybrid having an input in communication with an output of the near end transmitter, a near end replication transmitter, a high pass filter responsive to the near end replication transmitter, a subtractor to subtract an output from the high pass filter from the output from the near end transmitter and an output of the hybrid, and a near end receiver responsive to an output of the subtractor.

According to a second aspect of the present invention, the hybrid comprises an isolation transformer.

According to a third aspect of the present invention, the hybrid comprises an active circuit.

According to a fourth aspect of the present invention, the near end replication transmitter is adjustable.

According to a fifth aspect of the present invention, the near end replication transmitter comprises a current generator connected in parallel with an adjustable load.

According to a sixth aspect of the present invention, the near end replication transmitter comprises an adjustable current generator connected in parallel with a load.

According to a seventh aspect of the present invention, an adjustable capacitive load is provided in communication with the near end replication transmitter to maximize signal delay matching between the near end transmitter and the near end replication transmitter.

According to an eighth aspect of the present invention, an adaptive control circuit is provided and is responsive to the adaptive control circuit.

According to a ninth aspect of the present invention, the high pass filter comprises an inductor having similar characteristics as the hybrid.

According to a tenth aspect of the present invention, the high pass filter comprises a combination of a resistance and a capacitance.

According to an eleventh aspect of the present invention, a communication circuit comprises a near end transmitter, a hybrid having an input in communication with an output of the near end transmitter, a near end adjustable replication transmitter, a subtractor to subtract an output from the near end adjustable replication transmitter from the output from the near end transmitter and the hybrid, and a near end receiver responsive to an output of the subtractor.

According to a twelfth aspect of the present invention, a communication circuit comprises near end transmitting means for transmitting a transmitted signal, hybrid means having an input in communication with an output of the near end transmitting means for communicating the transmitted signal to and a received signal from a channel, near end replication transmitting means for generating a replication signal, high pass filter means for high pass filtering the replication signal, subtracting means for the high pass filtered replication signal from the transmitted and received signals, and near end receiving means for receiving an output signal from the subtracting means.

According to a thirteenth aspect of the present invention, a communication circuit comprises near end transmitting means for transmitting a transmitted signal, hybrid means having an input in communication with an output of the near end transmitting means for communicating the transmitted signal to and a received signal from a channel, near end adjustable replication transmitting means for generating an adjustable replication signal, subtracting means for subtracting the adjustable replication signal from the received signal and the transmitted signal, and near end receiving means for receiving an output of the subtracting means.

According to a fourteenth aspect of the present invention, a communication method comprises the steps of (a) transmitting a transmitted signal, (b) combining the transmitted signal with a received signal from a channel, (c) generating a replication signal, (d) high pass filtering the replication signal, (e) subtracting the high pass filtered replication signal from the transmitted and received signals, and (f) receiving an output signal from step (e).

According to a fifteenth aspect of the present invention, a communication method comprises the steps of (a) transmitting a transmitted signal, (b) combining the transmitted signal with a received signal from a channel, (c) generating a replication signal, (d) adjusting the replication signal, (e) subtracting adjusted replication signal from the transmitted and received signals, and (f) receiving an output signal from step (e).

According to a sixteenth aspect of the present invention, a communication circuit comprises a near end circuit and a far end circuit. The near end circuit comprises a near end transmitter, a near end hybrid having a first terminal in communication with an output of the near end transmitter and a second terminal, a near end replication transmitter, a near end high pass filter responsive to the near end replication transmitter, a near end subtractor to subtract an output from the near end high pass filter from the output from the near end transmitter and the near end hybrid, and a near end receiver responsive to an output of the near end subtractor. The far end circuit comprises a far end transmitter, a far end hybrid having a third terminal in communication with an output of the far end transmitter and a fourth terminal in communication with the second terminal of the near end hybrid, a far end replication transmitter, a far end high pass filter responsive to the far end replication transmitter, a far end subtractor to subtract an output from the far end high pass filter from the output from the far end transmitter and the far end hybrid, and a far end receiver responsive to an output of the far end subtractor.

According to a seventeenth aspect of the present invention, a communication circuit comprises a near end circuit and a far end circuit. The near end circuit comprises a near end transmitter, a near end hybrid having a first terminal in communication with an output of the near end transmitter and a second terminal, a near end adjustable replication transmitter, a near end subtractor to subtract an output from the near end adjustable replication transmitter from the output from the near end transmitter and the near end hybrid, and a near end receiver responsive to an output of the near end subtractor. The far end circuit comprises a far end transmitter, a far end hybrid having a third terminal in communication with an output of the far end transmitter and fourth terminal in communication with the second terminal of the near end hybrid, a far end adjustable replication transmitter, a far end subtractor to subtract an output from the far end adjustable replication transmitter from the output from the far end transmitter and the far end hybrid, and a far end receiver responsive to an output of the far end subtractor.

According to an eighteenth aspect of the present invention, a communication circuit comprises a near end communication means and a far end communication means. The near end communication means comprises near end transmitting means for transmitting a first signal, near end hybrid means having a first terminal in communication with an output of the near end transmitting means for communicating the first signal to and in communication with a second signal from a channel, near end replication transmitting means for transmitting a near end replication signal, near end high pass filter means for high pass filtering the near end replication signal, near end subtracting means for subtracting the near end high pass filtered replication signal from the first signal from the near end transmitting means and the second signal from the near end hybrid means, and near end receiving means for receiving an output signal from the near end subtracting means. The far end communication means comprises far end transmitting means for transmitting the second signal, far end hybrid means having a second terminal in communication with an output of the far end transmitting means for communicating the second signal to and the first signal from the channel, far end replication transmitting means for generating a far end replication signal, far end high pass filter means for high pass filtering the far end replication signal, subtracting means for the far end high pass filtered replication signal from the second signal from the far end transmitting means and the first signal from the far end hybrid means, and far end receiving means for receiving an output signal from the subtracting means.

According to a nineteenth aspect of the present invention, a communication circuit comprises a near end communication means and a far end communication means. The near end communication means comprises near end transmitting means for transmitting a first signal, near end hybrid means having an input in communication with an output of the near end transmitting means for communicating the first signal to and a second signal from a channel, near end adjustable replication transmitting means for generating a near end adjustable replication signal, near end subtracting means for subtracting the near end adjustable replication signal from the first signal from the near end transmitting means and the second signal from the near end hybrid means, and near end receiving means for receiving an output of the near end subtracting means. The far end communication means comprises far end transmitting means for transmitting the second signal, far end hybrid means having an input in communication with an output of the far end transmitting means for communicating the second signal to and the first signal from the channel, far end adjustable replication transmitting means for generating a far end adjustable replication signal, far end subtracting means for subtracting the far end adjustable replication signal from the second signal from the far end transmitting means and the first signal from the far end hybrid means, and far end receiving means for receiving an output of the far end subtracting means.

According to a twentieth aspect of the present invention, a communication method comprises the steps of (a) transmitting a first signal, (b) combining the first signal with a second signal from a channel, (c) generating a first replication signal, (d) high pass filtering the first replication signal, (e) subtracting the high pass filtered first replication signal from the first and second signals, receiving an output signal from step (e), (g) transmitting the second signal, (h) combining the second signal with the first signal from the channel, (i) generating a second replication signal, (j) high pass filtering the second replication signal, (k) subtracting the high pass filtered second replication signal from the first and second signals, and receiving an output signal from step (k).

According to a twenty-first aspect of the present invention, a communication method comprises the steps of (a) transmitting a first signal, (b) combining the first signal with a second signal from a channel, (c) generating a first replication signal, (d) adjusting the first replication signal, (e) subtracting the adjusted first replication signal from the first and second signals, receiving an output signal from step (e), (g) transmitting the second signal, (h) combining the second signal with the first signal from the channel, (i) generating a second replication signal, (j) adjusting the second replication signal, (k) subtracting the adjusted second replication signal from the first and second signals, and (l) receiving an output signal from step (k).

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Refer now to FIGS. 3A-16 for a description of the preferred embodiments of this invention.

Figure 1:
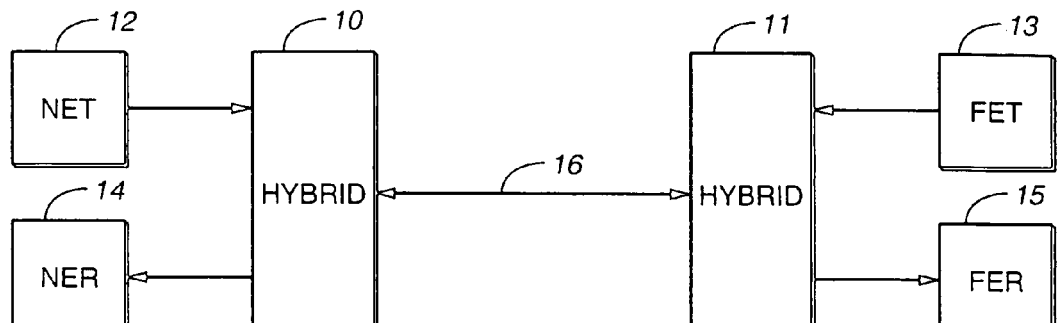
FIG. 1 is a block diagram of a conventional communication system.
Figure 2A:
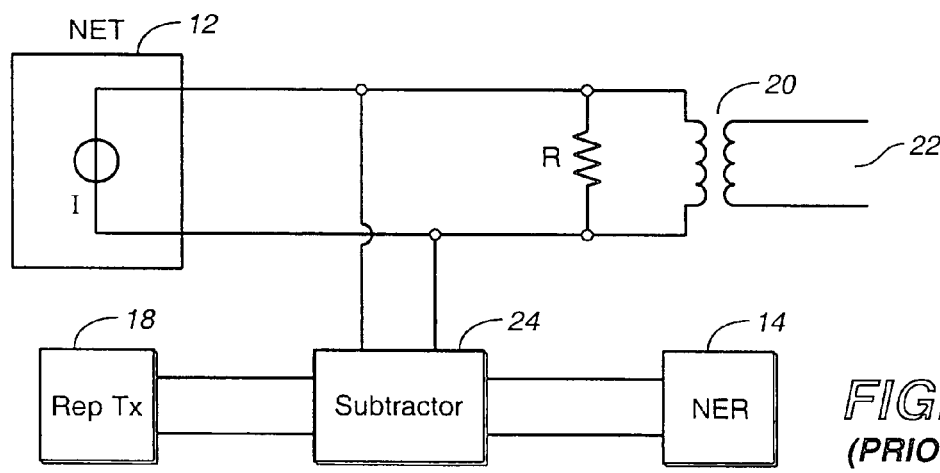
FIGS. 2A and 2B are schematic diagrams of conventional communication systems having NET noise attenuation.
Figure 2B:
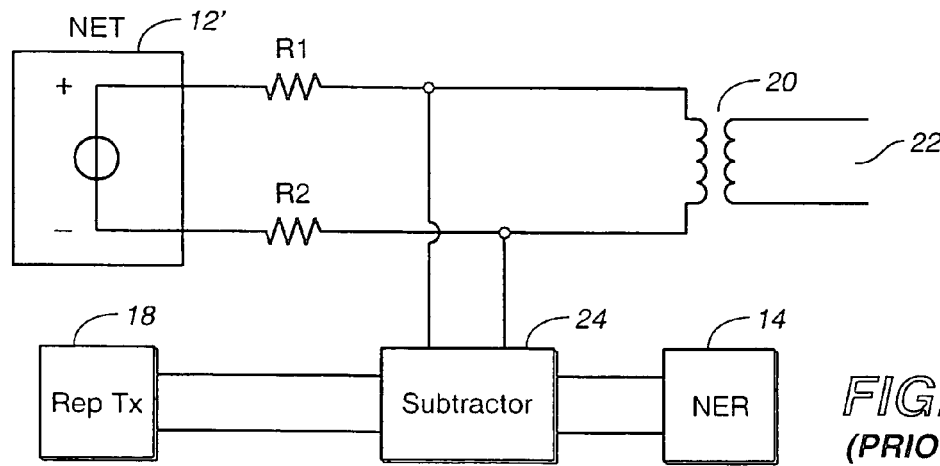
Figure 3A:
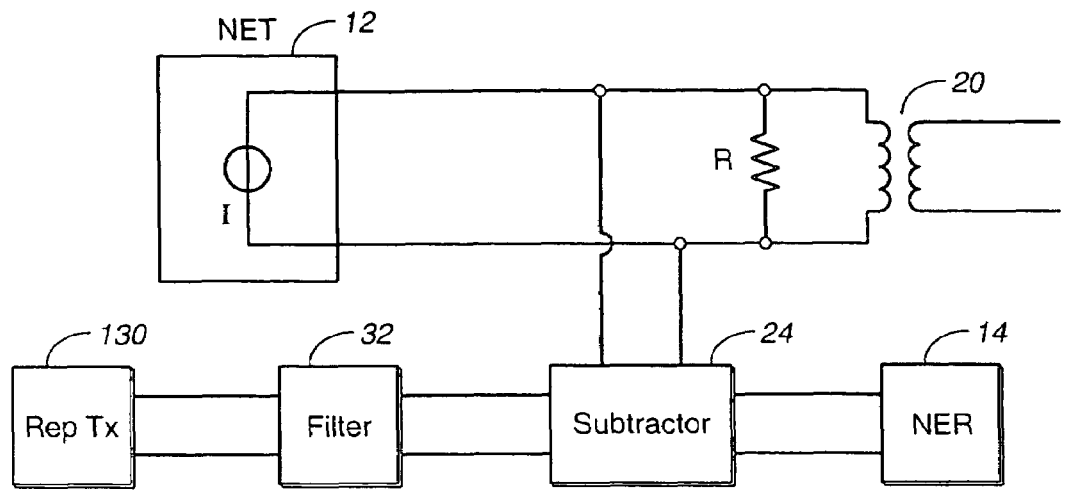
FIGS. 3A and 3B are schematic diagrams of the communication system of the first embodiment of the present invention having NET attenuation provided by a replication transmitter and a low pass filter arranged between the replication transmitter and the subtraction circuit.
Figure 3B:
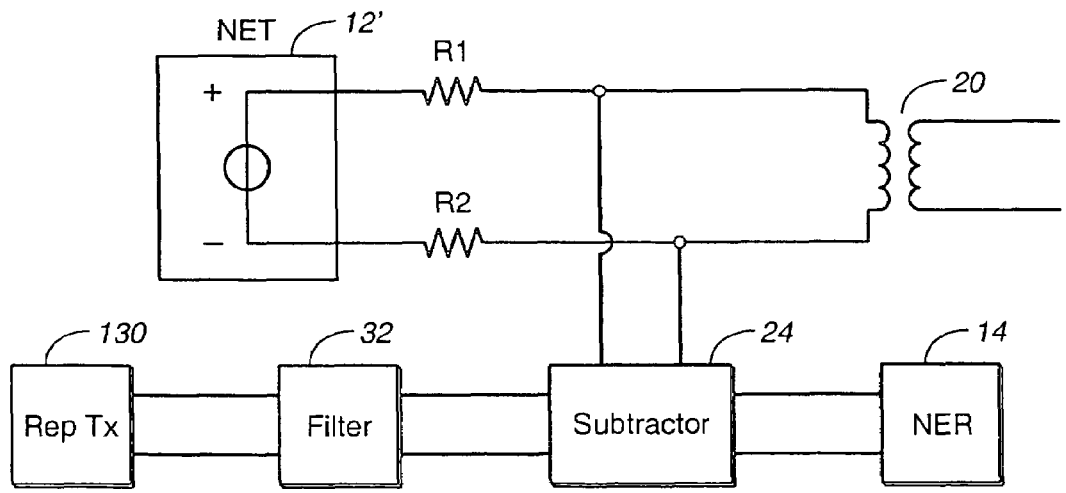

A first embodiment of the communication system of this invention is shown in FIGS. 3A and 3B. The present invention is preferably implemented in an Ethernet transceiver operating at 1000 Mbits/sec. As shown therein, near end transmitter 12 feeds the primary of an isolation transformer 20. The secondary of the isolation transformer 20 is connected to a twisted wire pair 22, which is connected to a far end circuit, not shown. The primary of the isolation transformer 20 is also fed to subtraction circuit 24, and an output of subtraction circuit 24 is input to near end receiver 14. In this embodiment, a replication transmitter 130 is provided to compensate for the effects of near end transmitter 12 as another input to subtraction circuit 24. A high pass filter 32 is further provided between replication transmitter 30 and subtraction circuit 24. The high pass filter compensates for the decreased load seen by the near end transmitter 12 at lower frequencies.

Figure 6:
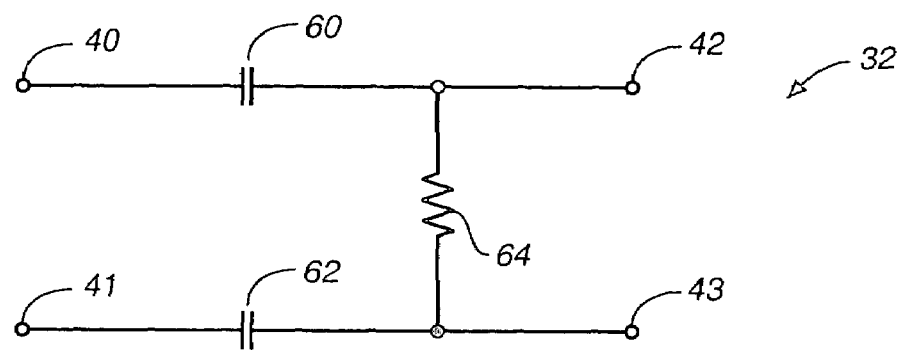
FIG. 6 is a schematic diagram of an example of a high pass filter.
Figure 7:
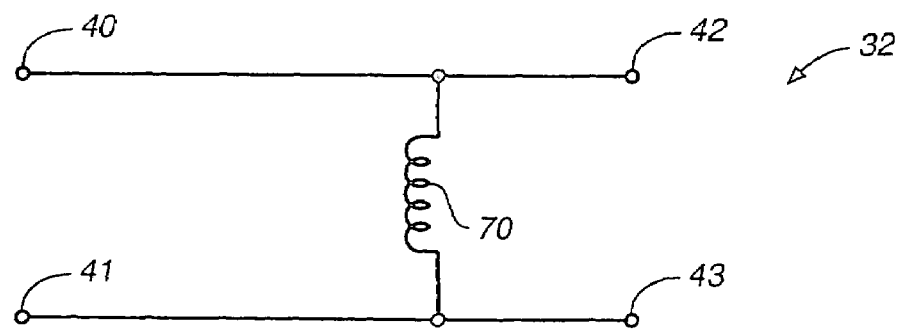
FIG. 7 is a schematic diagram of another example of a high pass filter.

FIGS. 6 and 7 show two circuits for realizing the high pass filter 32. The circuit of FIG. 6 shows an RC network having a first capacitor 60 connected between the first input 40 and first output 42, a second capacitor 62 connected between the second input 41 and second output 43, and a resistor 64 connected between the first output 42 and the second output 43. The filter of FIG. 6 reduces the amount of the voltages from the replication transmitter 130 reaching the subtraction network at lower frequencies.

The circuit of FIG. 7 illustrates a high pass filter implemented as an inductor 70. The inductor 70 places a load which decreases at decreasing frequencies between the first output and second output of the replication transmitter which reduces the amount of the voltages from the replication transmitter reaching the subtraction network at lower frequencies. The circuit of FIG. 7 has the added advantage that the inductor 70 can be chosen to match the inductance of the primary of the isolation transformer seen by the outputs of the near end transmitter. The inductor will simulate the DC wander behavior of NET 12. Alternatively, inductor 70 can be implemented by isolation transformer having the same characteristics of isolation transformer 20. However, this implementation is somewhat more costly than the matching inductor.

In such an arrangement, any DC components of the transmit signal exists in the replica path signal. By using this replica, a much simpler digital signal processor (DSP) based echo canceler may be employed to cancel any residual echo that is not cancelled.

Figure 4A:
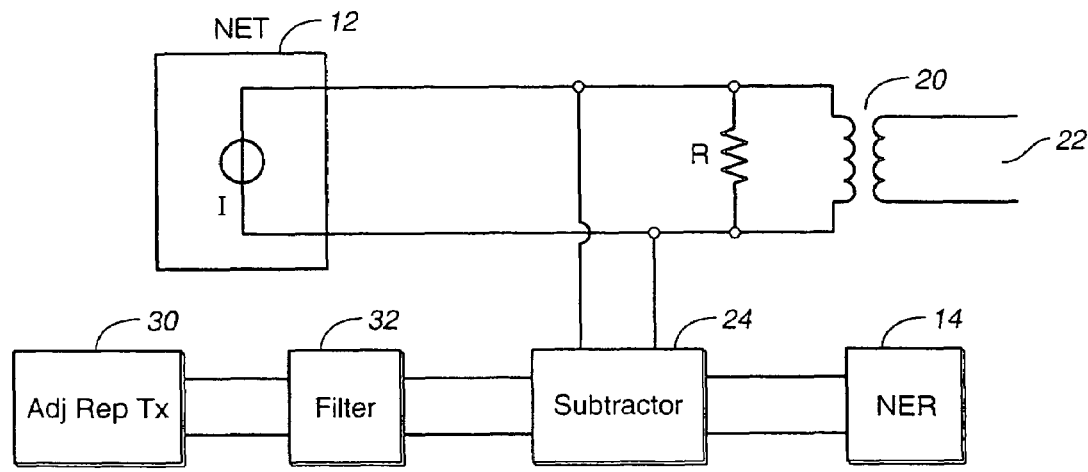
FIGS. 4A and 4B are schematic diagrams of the communication system of the second embodiment of the present invention having NET attenuation provided by an adjustable replication transmitter and a low pass filter arranged between the replication transmitter and the subtraction circuit.
Figure 4B:
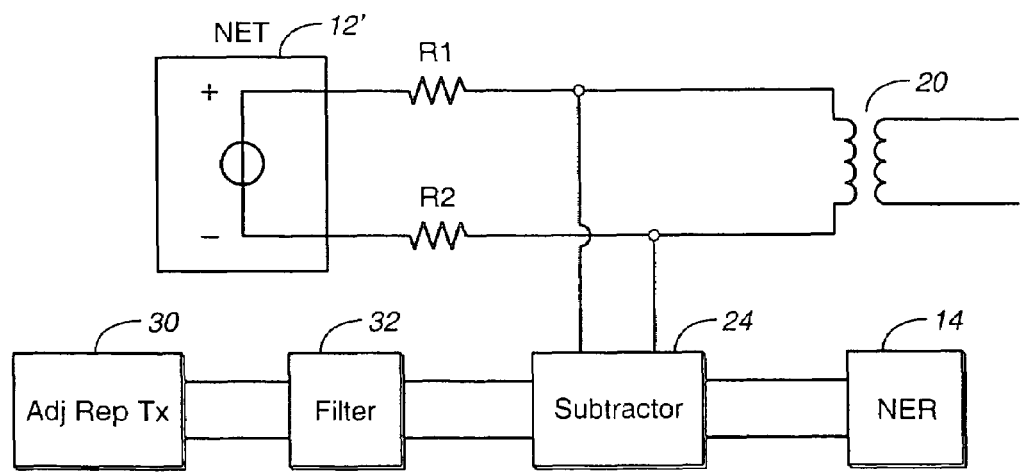

A second embodiment of the communication method of this invention is shown in FIGS. 4A and 4B. The second embodiment is similar to the first embodiment and replication transmitter 30 comprises an adjustable gain control to maximize the amplitude matching between the main signal path and the replica signal path.

Figure 11A:
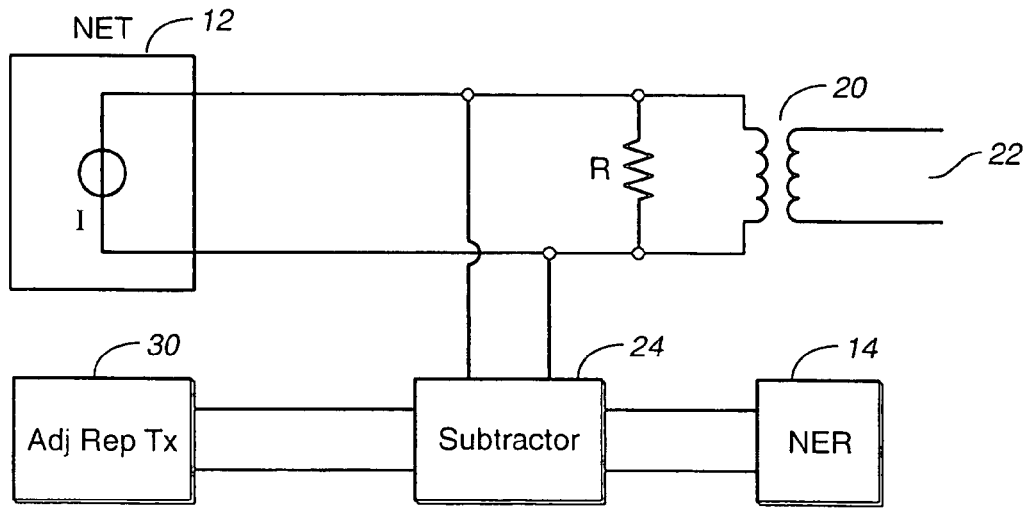
FIGS. 11A and 11B are schematic diagrams of the communication system of a third embodiment of the present invention having NET noise attenuation provided by an adjustable replication transmitter.
Figure 11B:
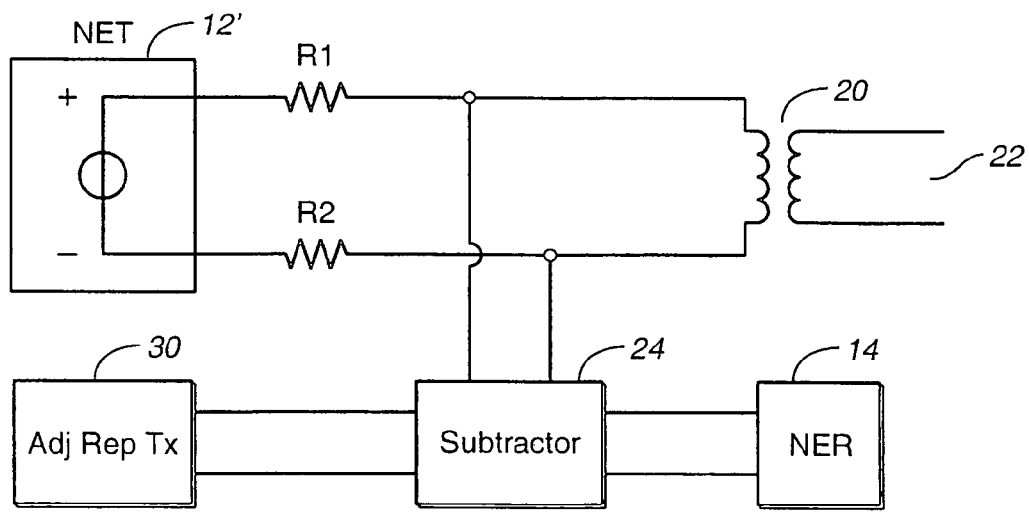

FIGS. 11A and 11B illustrate a third embodiment which is similar to the second embodiment, except that the high pass filter is omitted. In some implementations, the near end transmitter 12 may comprise a plurality of current sources. The outputs of the plurality of current sources are summed to generate the transmission signal.

Figure 5:
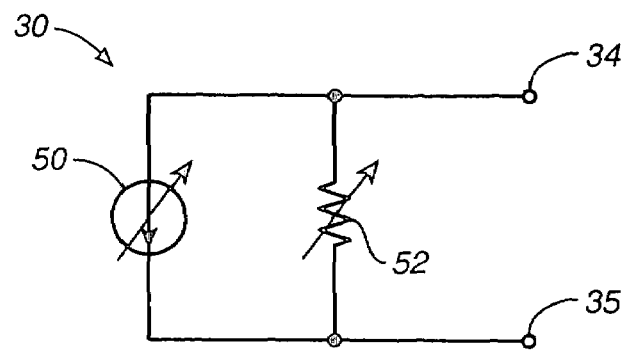
FIG. 5 is a schematic diagram of an example of an adjustable transmitter.

A circuit which can be used to realize adjustable replication transmitter 30 is shown in FIG. 5. The replication transmitter comprises a current source 50, connected in parallel with a load 52. Either current source 50, load or resistor 52, or both can be varied to produce the adjustable voltages at the output thereof.

Figure 8:
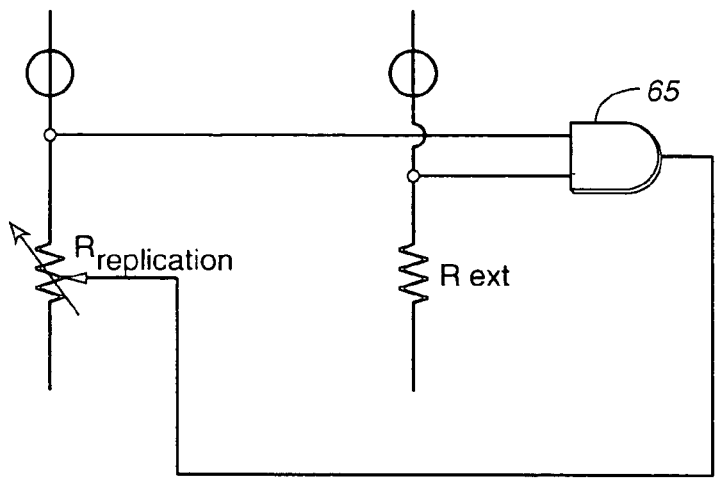
FIG. 8 is a schematic diagram of an example of a calibration circuit in accordance with the present invention.
Figure 9:
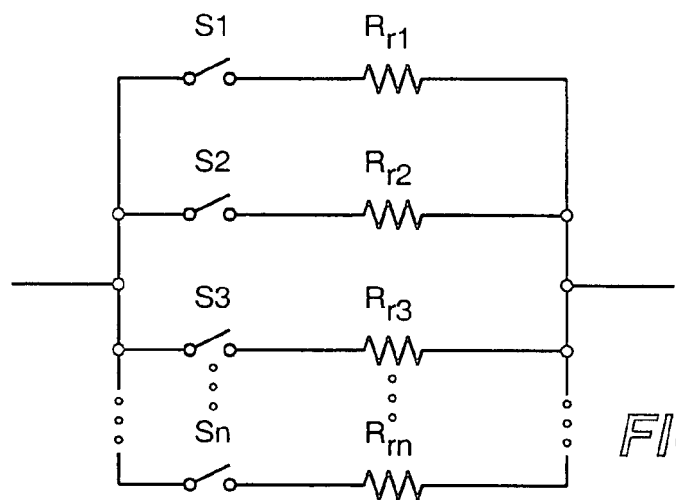
FIG. 9 is a schematic of an example of a variable resistance used in the calibration circuit of FIG. 8.
Figure 10:
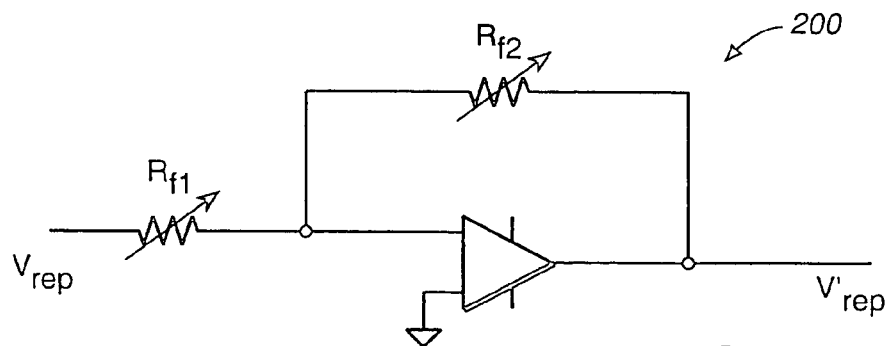
FIG. 10 is a schematic a diagram of an example of a voltage multiplier circuit.

FIG. 8 illustrates an example of a circuit to adjust or calibrate resistor R 52 to match output resistor R. As noted above one way to adjust the output of replication transmitter 30 to match the output NET 12 is to calibrate $R_{replication}$ 52 such that $R_{replication}$ 52 is substantial equal to R. This can be accomplished by providing an external resistor $R_{ext}$ which has the same value as the output resistor R. As shown in FIG. 8, the voltage developed across $R_{ext}$ is compared to $R_{replication}$ by comparator 65. $R_{replication}$ is adjusted until the voltages across $R_{ext}$ and $R_{replication}$ are substantially equal. FIG. 9 illustrates an example of an adjustable or variable resistance comprising n switchable resistances $R_{r1}$ through $R_{rn}$ which are switched by respective switches $S_1$ through $S_n$, in response to comparator 65. The calibration or adjustment of $R_{replication}$ can be conducted upon startup, continuously, on a timed basis or upon a manual request.

FIG. 9 illustrates another arrangement in which the output voltage of replication transmitter is adjusted by voltage multiplier 200. As is known by one of ordinary skill in the art, $V'_{rep}=V_{rep}*R_{F2}/R_{F1}$. In this arrangement, the output of comparator 65 is used to adjust or calibrate either one or both of $R_{F2}$ and $R_{F1}$. $R_{F2}$ and $R_{F1}$ can be implemented, for example, as shown in FIG. 9.

Figure 12:
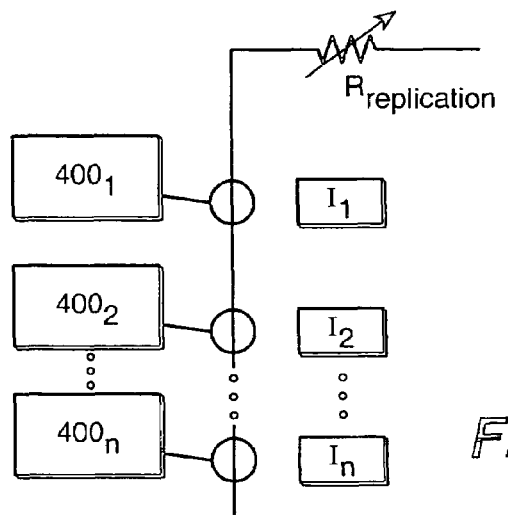
FIG. 12 is a diagram of another example of an adjustable transmitter.
Figure 13:
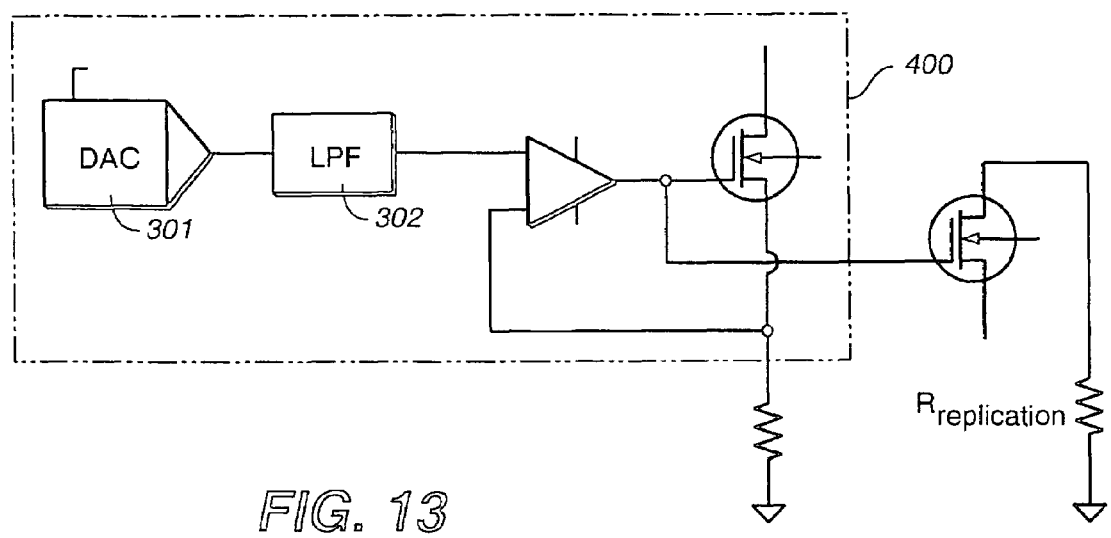
FIG. 13 is a schematic diagram of one of the power digital to analog converters of FIG. 12.

FIG. 12 is another implementation of replication transmitter 30. FIG. 12 illustrates a transmitter comprising n direct drive programmable high speed power digital-to-analog converters $400_1$-$400_n$. A complete description of such is provided in commonly assigned, copending application "Direct Drive Programmable High Speed Power Digital-to-Analog Converter," filed Dec. 18, 2000, and assigned U.S. application Ser. No. 09/737,474 (now U.S. Pat. No. 6,462,688), the contents of which are incorporated by reference herein. In accordance with I.E.E.E. standard 802.3ab, the transmitter provides 17 different levels which is accomplished by superpositioning selected ones of the direct drive programmable high speed power digital to analog converters $400_1$-$400_n$. In this arrangement, the replication transmitter comprises current sources $I_1 \ldots I_n$ configured in series to develop an output voltage across $R_{replication}$. In this arrangement, $R_{replication}$ may be adjustable similarly as described above. Alternatively, $R_{replication}$ may be fixed and the output voltage may be multiplied by a voltage multiplier similar to that of voltage multiplier 200. FIG. 13 shows the details of one of the direct drive programmable high speed power digital-to-analog converters $400_1$ and a detailed explanation of which can be found in the aforementioned commonly-assigned application.

Figure 14:
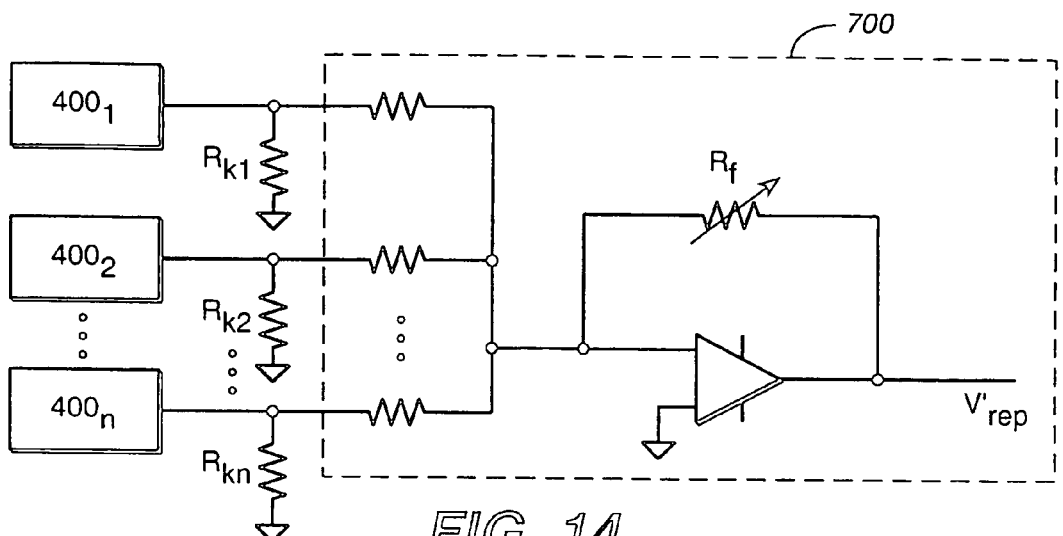
FIG. 14 is a diagram of a further example of an adjustable transmitter.
Figure 15:
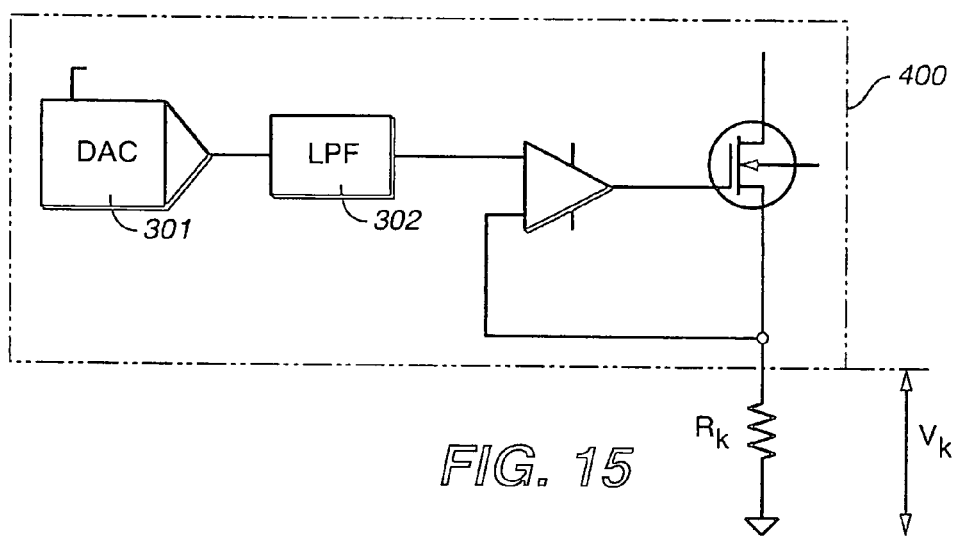
FIG. 15 is a schematic diagram of one of the power digital to analog converters of FIG. 14.
Figure 16:
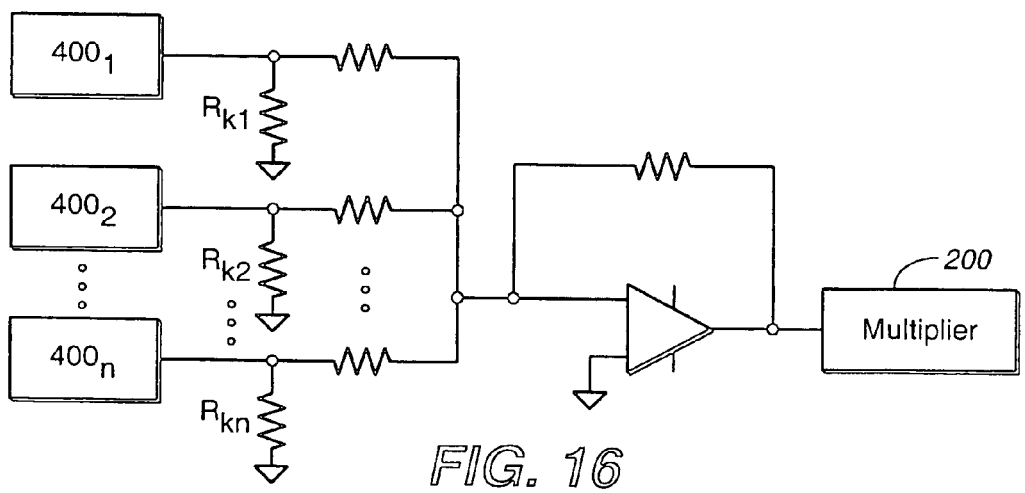
FIG. 16 is a diagram of an additional example of an adjustable transmitter.

FIGS. 14 and 15 show another embodiment which is a simplification to that in FIGS. 11 and 12. The inventor has observed that a replication voltage for each DAC is developed across each resistor $R_k$. Accordingly, the voltages developed can be summed by summing circuit 700. It is noted that resistor $R_f$ is adjustable as in the previous embodiments. FIG. 16 illustrates a variant to FIG. 15, where instead of calibrating feedback resistor $R_k$, the output voltage is multiplied by multiplier 200 as described above.

As a further variation to the preceding embodiments, it is proposed to provide an adjustable capacitive loading in the replica signal path to maximize the signal delay matching between the main signal path and the replica signal path. The main signal path does not see any changes as a result of adjusting replication transmitter 30, since replication transmitter 30 is not connected to the main signal path.

Adjustable replication transmitter may include an adaptive circuit for adjusting the capacitive loading to maximize the signal delay matching between the main signal path and the replica signal path.

While the invention has been particularly shown and described with reference to the preferred embodiments thereof, it will be understood by those skilled in the art that various changes in form and details may be made without departing from the spirit and scope of the invention. It is well within the scope of one of ordinary skill in the art to implement any of the functional circuits described herein. More specifically while the hybrid of the present embodiment is illustrated as an isolation transformer; one skilled in the art would appreciate an active circuit being substituted for the isolation transformer.

The invention claimed is:

1. A communication circuit comprising:
a near end transmitter,
wherein the near end transmitter is configured to generate a transmission signal,
wherein the near end transmitter comprises a first plurality of current sources, and
wherein outputs of the first plurality of current sources are summed to generate the transmission signal;
an adjustable near end replication transmitter,
wherein the adjustable near end replication transmitter comprises a second plurality of current sources,
wherein outputs of the second plurality of current sources are summed to generate a replication signal in accordance with the transmission signal, and
wherein the replication signal from the adjustable near end replication transmitter is subtracted from the transmission signal from the near end transmitter and a received signal from a communication channel to generate a subtraction signal; and
a near end receiver,
wherein the near end receiver is configured to receive the subtraction signal.

2. The communication circuit of claim 1, comprising:
a summing circuit,
wherein the summing circuit is configured to subtract the replication signal from a combination of the transmission signal and the received signal to generate the subtraction signal.

3. The communication circuit of claim 2, wherein the summing circuit comprises an active summing circuit.

4. The communication circuit of claim 1, comprising:
a high pass filter,
wherein the high pass filter is responsive to the adjustable near end replication transmitter.

5. The communication circuit of claim 4, wherein the high pass filter comprises one of an inductance and a combination of a resistance and a capacitance.

6. A communication circuit, comprising:
near end transmitting means for generating a transmission signal,
wherein the near end transmitting means comprises a first plurality of means for generating current, and
wherein outputs of the first plurality of current generating means are summed to generate the transmission signal;
adjustable near end replication transmitting means for generating a replication signal in accordance with the transmission signal,
wherein the adjustable near end replication transmitting means comprises a second plurality of means for generating current,
wherein outputs of the second plurality of current generating means are summed to generate the replication signal, and
wherein the replication signal from the adjustable near end replication transmitting means is subtracted from the transmission signal from the near end transmitting means and a received signal from a communication channel to generate a subtraction signal; and
a near end receiving means for receiving the subtraction signal.

7. The communication circuit of claim 6, comprising:
means for summing,
wherein the summing means is configured to subtract the replication signal from a combination of the transmission signal and the received signal to generate the subtraction signal.

8. The communication circuit of claim 7, wherein the summing means comprises an active summing means.

9. The communication circuit of claim 6, comprising:
a high pass filter means for high pass filtering the replication signal from the adjustable near end replication transmitting means.

10. The communication circuit of claim 1, wherein the high pass filter means comprises one of an inductor means and a combination of a resistor means and a capacitor means.

11. A method of communicating signals, comprising the steps of:
a.) transmitting a transmission signal;
b.) generating a first plurality of current signals;
c.) summing the first plurality of current signals to generate an adjustable replication signal in accordance with the transmission signal;
d.) subtracting the adjustable replication signal from a combination of the transmission signal and a received signal from a communication channel; and
e.) receiving an output signal of step (d),
wherein step (a) comprises the steps of:
f.) generating a second plurality of current signals; and
g.) summing the second plurality of current signals to generate the transmission signal.

12. The method of claim 11, comprising the step of:
f.) high pass filtering the adjustable replication signal.

13. An Ethernet transceiver, comprising:
a near end transmitter,
wherein the near end transmitter is configured to generate a transmission signal,
wherein the near end transmitter includes a first plurality of current sources, and
wherein outputs of the first plurality of current sources are combined to generate the transmission signal;
an adjustable near end replica transmitter,
wherein the adjustable near end replica transmitter includes a second plurality of current sources,
wherein outputs of the second plurality of current sources are combined to generate a replica signal in accordance with the transmission signal, and
wherein the replica signal from the adjustable near end replica transmitter is subtracted from a combination of the transmission signal from the near end transmitter and a received signal from a communication channel to generate an output signal; and
a near end receiver,
wherein the near end receiver is configured to receive the output signal.

14. The Ethernet transceiver of claim 13, comprising:
a summer circuit,
wherein the summer circuit is configured to subtract the replica signal from the combination of the transmission signal and the received signal to generate the output signal.

15. The Ethernet transceiver of claim 14, wherein the summer circuit comprises an active summer circuit.

16. The Ethernet transceiver of claim 13, comprising:
a high pass filter,
wherein the high pass filter is responsive to the adjustable near end replica transmitter.

17. The Ethernet transceiver of claim 16, wherein the high pass filter comprises one of an inductance and a combination of a resistance and a capacitance.

18. An Ethernet transceiver, comprising:
- near end transmitting means for generating a transmission signal,
  - wherein the near end transmitting means includes a first plurality of means for generating current, and
  - wherein outputs of the first plurality of current generating means are combined to generate the transmission signal,
- adjustable near end replica transmitting means for generating a replica signal in accordance with the transmission signal,
  - wherein the adjustable near end replica transmitting means includes a second plurality of means for generating current,
  - wherein outputs of the second plurality of current generating means are combined to generate the replica signal, and
  - wherein the replica signal from the adjustable near end replica transmitting means is subtracted from a combination of the transmission signal from the near end transmitting means and a received signal from a communication channel to generate an output signal; and
- a near end receiving means for receiving the output signal.

19. The Ethernet transceiver of claim 18, comprising:
means for subtracting the replica signal from the combination of the transmission signal and the received signal to generate the output signal.

20. The Ethernet transceiver of claim 19, wherein the subtracting means comprises an active subtracting means.

21. The Ethernet transceiver of claim 18, comprising:
a high pass filter means for high pass filtering the replica signal from the adjustable near end replica transmitting means.

22. The Ethernet transceiver of claim 21, wherein the high pass filter means comprises one of an inductor means and a combination of a resistor means and a capacitor means.

* * * * *